(12) United States Patent
Yokomizo

(10) Patent No.: US 7,270,137 B2
(45) Date of Patent: Sep. 18, 2007

(54) APPARATUS AND METHOD OF SECURING A WORKPIECE DURING HIGH-PRESSURE PROCESSING

(75) Inventor: Kenji Yokomizo, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 361 days.

(21) Appl. No.: 10/425,701

(22) Filed: Apr. 28, 2003

(65) Prior Publication Data

US 2004/0211447 A1  Oct. 28, 2004

(51) Int. Cl.
  *B08B 11/02* (2006.01)
  *B08B 7/00* (2006.01)
(52) U.S. Cl. .................. 134/186; 134/200; 134/902
(58) Field of Classification Search .............. 134/105, 134/184, 186, 200, 902
See application file for complete search history.

(56) References Cited

U.S. PATENT DOCUMENTS

| | | | |
|---|---|---|---|
| 2,617,719 A | 11/1952 | Stewart | |
| 2,625,686 A | 1/1953 | Browne | |
| 2,873,597 A | 2/1959 | Fahringer | |
| 3,521,765 A | 7/1970 | Kauffman et al. | |
| 3,623,627 A | 11/1971 | Bolton | |
| 3,681,171 A | 8/1972 | Hojo et al. | |
| 3,689,025 A | 9/1972 | Kiser | |
| 3,744,660 A | 7/1973 | Gaines et al. | |
| 3,968,885 A | 7/1976 | Hassan et al. | |
| 4,029,517 A | 6/1977 | Rand | |
| 4,091,643 A | 5/1978 | Zucchini | |
| 4,145,161 A | 3/1979 | Skinner | |
| 4,245,154 A | 1/1981 | Uehara et al. | |
| 4,341,592 A | 7/1982 | Shortes et al. | |
| 4,355,937 A | 10/1982 | Mack et al. | |
| 4,367,140 A | 1/1983 | Wilson | |
| 4,391,511 A | 7/1983 | Akiyama et al. | |
| 4,406,596 A | 9/1983 | Budde | |
| 4,422,651 A | 12/1983 | Platts | |
| 4,426,358 A | 1/1984 | Johansson | |

(Continued)

FOREIGN PATENT DOCUMENTS

CH    SE 251213    8/1948

(Continued)

OTHER PUBLICATIONS

Hideaki Itakura et al., "Multi-Chamber Dry Etching System", Solid State Technology, Apr. 1982, pp. 209-214.

(Continued)

*Primary Examiner*—Joseph L. Perrin
(74) *Attorney, Agent, or Firm*—Haverstock & Owens LLP

(57) ABSTRACT

An apparatus is disclosed for performing high-pressure processing of a workpiece having a top face and a bottom face. The apparatus comprises a processing chamber and a holder for securing the workpiece within the processing chamber so that a substantial portion of the top face and a substantial portion of the bottom face is exposed to a processing material introduced into the processing chamber. In one embodiment, the holder comprises an upper segment and a lower segment. The lower segment contacts the workpiece at or near an edge of the workpiece, thus supporting the workpiece in a first vertical direction and securing it in a horizontal plane. The upper segment contacts the workpiece at or near an edge of the workpiece, securing it in a second vertical direction.

23 Claims, 13 Drawing Sheets

U.S. PATENT DOCUMENTS

| | | | |
|---|---|---|---|
| 4,474,199 A | 10/1984 | Blaudszun | |
| 4,522,788 A | 6/1985 | Sitek et al. | |
| 4,549,467 A | 10/1985 | Wilden et al. | |
| 4,574,184 A | 3/1986 | Wolf et al. | |
| 4,592,306 A | 6/1986 | Gallego | |
| 4,601,181 A | 7/1986 | Privat | |
| 4,626,509 A | 12/1986 | Lyman | |
| 4,670,126 A | 6/1987 | Messer et al. | |
| 4,682,937 A | 7/1987 | Credle, Jr. | |
| 4,693,777 A | 9/1987 | Hazano et al. | |
| 4,749,440 A | 6/1988 | Blackwood et al. | |
| 4,778,356 A | 10/1988 | Hicks | |
| 4,788,043 A | 11/1988 | Kagiyama et al. | |
| 4,789,077 A | 12/1988 | Noe | |
| 4,823,976 A | 4/1989 | White, III et al. | |
| 4,825,808 A | 5/1989 | Takahashi et al. | |
| 4,827,867 A | 5/1989 | Takel et al. | |
| 4,838,476 A | 6/1989 | Rahn | |
| 4,865,061 A | 9/1989 | Fowler et al. | |
| 4,879,431 A | 11/1989 | Bertoncini | |
| 4,917,556 A | 4/1990 | Stark et al. | |
| 4,924,892 A | 5/1990 | Kiba et al. | |
| 4,951,601 A | 8/1990 | Maydan et al. | |
| 4,960,140 A | 10/1990 | Ishijima et al. | |
| 4,983,223 A | 1/1991 | Gessner | |
| 5,009,738 A | 4/1991 | Gruenwald et al. | |
| 5,011,542 A | 4/1991 | Weil | |
| 5,028,219 A | 7/1991 | Schuetz et al. | 417/423.4 |
| 5,044,871 A | 9/1991 | Davis et al. | |
| 5,062,770 A | 11/1991 | Story et al. | |
| 5,071,485 A | 12/1991 | Matthews et al. | |
| 5,105,556 A | 4/1992 | Kurokawa et al. | |
| 5,143,103 A | 9/1992 | Basso et al. | |
| 5,167,716 A | 12/1992 | Boitnott et al. | |
| 5,169,296 A | 12/1992 | Wilden | |
| 5,169,408 A | 12/1992 | Biggerstaff et al. | |
| 5,185,296 A | 2/1993 | Morita et al. | |
| 5,186,594 A | 2/1993 | Toshima et al. | |
| 5,186,718 A | 2/1993 | Tepman et al. | |
| 5,188,515 A | 2/1993 | Horn | |
| 5,190,373 A | 3/1993 | Dickson et al. | |
| 5,191,993 A | 3/1993 | Wanger et al. | |
| 5,217,043 A | 6/1993 | Novakovi | |
| 5,242,641 A | 9/1993 | Horner et al. | 264/104 |
| 5,252,041 A | 10/1993 | Schumack | |
| 5,259,731 A | 11/1993 | Dhindsa et al. | |
| 5,306,350 A | 4/1994 | Hoy et al. | |
| 5,374,829 A | 12/1994 | Sakamoto et al. | |
| 5,434,107 A | 7/1995 | Paranjpe | 437/225 |
| 5,474,410 A | 12/1995 | Ozawa et al. | |
| 5,494,526 A | 2/1996 | Paranjpe | |
| 5,540,554 A | 7/1996 | Masuzawa | |
| 5,672,204 A | 9/1997 | Habuka | 117/204 |
| 5,679,169 A | 10/1997 | Gonzales et al. | |
| 5,769,588 A | 6/1998 | Toshima et al. | |
| 5,772,783 A | 6/1998 | Stucker | |
| 5,817,178 A | 10/1998 | Mita et al. | 118/666 |
| 5,850,747 A | 12/1998 | Roberts et al. | |
| 5,858,107 A | 1/1999 | Chao et al. | |
| 5,865,602 A | 2/1999 | Nozari | |
| 5,879,459 A | 3/1999 | Gadgil et al. | |
| 5,882,165 A | 3/1999 | Maydan et al. | |
| 5,882,182 A | 3/1999 | Kato et al. | 417/366 |
| 5,888,050 A | 3/1999 | Fitzgerald et al. | |
| 5,898,727 A | 4/1999 | Fujikawa et al. | |
| 5,900,107 A | 5/1999 | Murphy et al. | |
| 5,904,737 A | 5/1999 | Preston et al. | |
| 5,906,866 A | 5/1999 | Webb | |
| 5,928,389 A | 7/1999 | Jevtic | |
| 5,932,100 A | 8/1999 | Yager et al. | |
| 5,934,856 A | 8/1999 | Asakawa et al. | |
| 5,934,991 A | 8/1999 | Rush | |
| 5,943,721 A | 8/1999 | Lerette et al. | |
| 5,946,945 A | 9/1999 | Kegler et al. | |
| 5,970,554 A | 10/1999 | Shore et al. | |
| 5,971,714 A | 10/1999 | Schaffer et al. | |
| 5,975,492 A | 11/1999 | Brenes | |
| 5,979,306 A | 11/1999 | Fujikawa et al. | |
| 5,980,648 A | 11/1999 | Adler | |
| 5,981,399 A | 11/1999 | Kawamura et al. | |
| 5,989,342 A | 11/1999 | Ikeda et al. | |
| 6,005,226 A | 12/1999 | Aschner et al. | |
| 6,010,315 A | 1/2000 | Kishimoto et al. | 417/228 |
| 6,017,820 A | 1/2000 | Ting et al. | |
| 6,021,791 A | 2/2000 | Dryer et al. | |
| 6,029,371 A | 2/2000 | Kamikawa et al. | |
| 6,035,871 A | 3/2000 | Eui-Yeol | |
| 6,037,277 A | 3/2000 | Masakara et al. | |
| 6,041,817 A | 3/2000 | Guertin | |
| 6,045,331 A | 4/2000 | Gehm et al. | |
| 6,048,494 A | 4/2000 | Annapragada | |
| 6,053,348 A | 4/2000 | Morch | |
| 6,056,008 A | 5/2000 | Adams et al. | |
| 6,062,853 A | 5/2000 | Shimazu et al. | |
| 6,067,728 A | 5/2000 | Farmer et al. | |
| 6,070,440 A | 6/2000 | Malchow et al. | |
| 6,077,053 A | 6/2000 | Fujikawa et al. | |
| 6,077,321 A | 6/2000 | Adachi et al. | |
| 6,082,150 A | 7/2000 | Stucker | |
| 6,085,935 A | 7/2000 | Malchow et al. | |
| 6,089,377 A | 7/2000 | Shimizu | |
| 6,097,015 A | 8/2000 | McCullough et al. | |
| 6,103,638 A | 8/2000 | Robinson | 438/778 |
| 6,109,296 A | 8/2000 | Austin | |
| 6,122,566 A | 9/2000 | Nguyen et al. | |
| 6,123,510 A | 9/2000 | Greer et al. | |
| 6,128,830 A | 10/2000 | Bettcher et al. | |
| 6,145,519 A | 11/2000 | Konishi et al. | |
| 6,155,436 A * | 12/2000 | Smick et al. | 211/41.18 |
| 6,159,295 A | 12/2000 | Maskara et al. | |
| 6,164,297 A | 12/2000 | Kamikawa | |
| 6,186,722 B1 | 2/2001 | Shirai | |
| 6,190,459 B1 | 2/2001 | Takeshita et al. | 118/715 |
| 6,203,582 B1 | 3/2001 | Berner et al. | |
| 6,216,364 B1 | 4/2001 | Tanaka et al. | |
| 6,221,781 B1 | 4/2001 | Siefering et al. | |
| 6,228,563 B1 | 5/2001 | Starov et al. | |
| 6,235,634 B1 | 5/2001 | White et al. | |
| 6,239,038 B1 | 5/2001 | Wen | |
| 6,241,825 B1 | 6/2001 | Wytman | |
| 6,244,121 B1 | 6/2001 | Hunter | |
| 6,251,250 B1 | 6/2001 | Keigler | |
| 6,264,003 B1 | 7/2001 | Dong et al. | 184/104.1 |
| 6,264,752 B1 * | 7/2001 | Curtis et al. | 118/729 |
| 6,264,753 B1 | 7/2001 | Chao et al. | |
| 6,277,753 B1 | 8/2001 | Mullee et al. | |
| 6,286,231 B1 | 9/2001 | Bergman et al. | |
| 6,305,677 B1 | 10/2001 | Lenz | |
| 6,306,564 B1 | 10/2001 | Mullee | |
| 6,333,268 B1 | 12/2001 | Starov et al. | |
| 6,334,266 B1 | 1/2002 | Moritz et al. | |
| 6,344,174 B1 | 2/2002 | Miller et al. | |
| 6,355,072 B1 | 3/2002 | Racette et al. | |
| 6,363,292 B1 | 3/2002 | McLoughlin | |
| 6,388,317 B1 | 5/2002 | Reese | |
| 6,389,677 B1 | 5/2002 | Lenz | |
| 6,406,782 B2 | 6/2002 | Johnson et al. | |
| 6,418,956 B1 | 7/2002 | Bloom | |
| 6,423,642 B1 * | 7/2002 | Peace et al. | 438/694 |
| 6,433,342 B1 * | 8/2002 | Cordts et al. | 250/440.11 |
| 6,436,824 B1 | 8/2002 | Chooi et al. | |
| 6,454,519 B1 | 9/2002 | Toshima et al. | |
| 6,454,945 B1 | 9/2002 | Weigl et al. | |
| 6,464,790 B1 | 10/2002 | Shertinsky et al. | |

| | | | |
|---|---|---|---|
| 6,465,403 B1 | 10/2002 | Skee | |
| 6,497,239 B2 | 12/2002 | Farmer et al. | |
| 6,508,259 B1 | 1/2003 | Tseronis et al. | 134/105 |
| 6,509,141 B2 | 1/2003 | Mullee | |
| 6,521,466 B1 | 2/2003 | Castrucci | |
| 6,532,772 B1 | 3/2003 | Robinson | 65/182.2 |
| 6,541,278 B2 | 4/2003 | Morita et al. | |
| 6,546,946 B2 | 4/2003 | Dunmire | |
| 6,548,411 B2 * | 4/2003 | Wirth et al. | 438/694 |
| 6,550,484 B1 | 4/2003 | Gopinath et al. | |
| 6,558,475 B1 | 5/2003 | Jur et al. | |
| 6,561,213 B2 | 5/2003 | Wang et al. | |
| 6,561,220 B2 | 5/2003 | McCullough et al. | |
| 6,561,481 B1 | 5/2003 | Filonczuk | |
| 6,561,767 B2 | 5/2003 | Biberger et al. | |
| 6,564,826 B2 | 5/2003 | Shen | |
| 6,596,093 B2 | 7/2003 | DeYoung et al. | |
| 6,612,317 B2 | 9/2003 | Costantini et al. | |
| 6,613,105 B1 | 9/2003 | Moore | 29/25.01 |
| 6,616,414 B2 | 9/2003 | Yoo et al. | |
| 6,635,565 B2 | 10/2003 | Wu et al. | |
| 6,641,678 B2 | 11/2003 | DeYoung et al. | |
| 6,642,140 B1 | 11/2003 | Moore | 438/631 |
| 6,722,642 B1 | 4/2004 | Sutton et al. | |
| 6,736,149 B2 | 5/2004 | Biberger et al. | |
| 6,764,212 B1 | 7/2004 | Nitta et al. | 366/114 |
| 6,764,552 B1 | 7/2004 | Joyce et al. | |
| 6,805,801 B1 | 10/2004 | Humayun et al. | |
| 6,806,194 B2 * | 10/2004 | Wirth et al. | 438/694 |
| 6,815,922 B2 | 11/2004 | Yoo et al. | |
| 6,851,148 B2 | 2/2005 | Preston et al. | |
| 6,874,513 B2 | 4/2005 | Yamagata et al. | |
| 6,921,456 B2 | 7/2005 | Biberger et al. | |
| 6,966,967 B2 | 11/2005 | Curry et al. | |
| 2001/0050096 A1 | 12/2001 | Costantini et al. | |
| 2002/0001929 A1 | 1/2002 | Biberger et al. | |
| 2002/0014257 A1 | 2/2002 | Chandra et al. | 134/19 |
| 2002/0046707 A1 | 4/2002 | Biberger et al. | |
| 2002/0189543 A1 | 12/2002 | Biberger et al. | |
| 2003/0005948 A1 | 1/2003 | Matsuno et al. | |
| 2003/0036023 A1 | 2/2003 | Moreau et al. | |
| 2003/0051741 A1 | 3/2003 | DeSimone et al. | |
| 2003/0098040 A1 * | 5/2003 | Nam et al. | 134/1.3 |
| 2003/0161734 A1 | 8/2003 | Kim | |
| 2003/0196679 A1 | 10/2003 | Cotte et al. | |
| 2003/0196683 A1 * | 10/2003 | Izumi et al. | 134/2 |
| 2003/0205510 A1 | 11/2003 | Jackson | |
| 2004/0020518 A1 | 2/2004 | DeYoung et al. | |
| 2004/0103922 A1 | 6/2004 | Inoue et al. | 134/26 |
| 2004/0134515 A1 | 7/2004 | Castrucci | |
| 2004/0157463 A1 | 8/2004 | Jones | |
| 2004/0211440 A1 | 10/2004 | Wang et al. | 134/2 |
| 2004/0213676 A1 | 10/2004 | Philips et al. | |
| 2005/0014370 A1 | 1/2005 | Jones | |
| 2005/0026547 A1 | 2/2005 | Moore et al. | |
| 2005/0111987 A1 | 5/2005 | Yoo et al. | |
| 2005/0141998 A1 | 6/2005 | Yoo et al. | |
| 2005/0158178 A1 | 7/2005 | Yoo et al. | |
| 2005/0191184 A1 | 9/2005 | Vinson, Jr. | |
| 2006/0130966 A1 | 6/2006 | Babic et al. | |

FOREIGN PATENT DOCUMENTS

| | | |
|---|---|---|
| CN | 1399790 A | 2/2003 |
| DE | 36 08 783 A1 | 9/1987 |
| DE | 198 60 084 A1 | 7/2000 |
| EP | 0 244 951 A2 | 11/1987 |
| EP | 0 272 141 A2 | 6/1988 |
| EP | 0 453 867 A1 | 10/1991 |
| EP | 0 572 913 A1 | 12/1993 |
| EP | 0 587 168 A1 | 3/1994 |
| EP | 0 679 753 B1 | 11/1995 |
| EP | 0 726 099 A2 | 8/1996 |
| EP | 0 743 379 A1 | 11/1996 |
| EP | 0 903 775 A2 | 3/1999 |
| FR | 1.499.491 | 9/1967 |
| GB | 2 003 975 | 3/1979 |
| GB | 2 193 482 | 2/1988 |
| JP | 56-142629 | 11/1981 |
| JP | 60-238479 | 11/1985 |
| JP | 60-246635 | 12/1985 |
| JP | 61-017151 | 1/1986 |
| JP | 61-231166 | 10/1986 |
| JP | 62-111442 | 5/1987 |
| JP | 62-125619 | 6/1987 |
| JP | 63-179530 | 7/1988 |
| JP | 63-256326 | 10/1988 |
| JP | 63-303059 | 12/1988 |
| JP | 2-148841 | 6/1990 |
| JP | 2-209729 | 8/1990 |
| JP | 4-17333 | 1/1992 |
| JP | 4-284648 | 10/1992 |
| JP | 40 5283511 A | 10/1993 |
| JP | 7-24679 | 3/1995 |
| JP | 7-283104 | 10/1995 |
| JP | 8-186140 | 7/1996 |
| JP | 8-206485 | 8/1996 |
| JP | 8-252549 | 10/1996 |
| JP | 9-43857 | 2/1997 |
| JP | 10-144757 | 5/1998 |
| JP | 10-260537 | 9/1998 |
| JP | 10-335408 | 12/1998 |
| JP | 11-200035 | 7/1999 |
| JP | 11-274132 | 10/1999 |
| JP | 2000/106358 | 4/2000 |
| JP | 2001-77074 | 3/2001 |
| WO | WO 87/07309 | 12/1987 |
| WO | WO 91/12629 | 8/1991 |
| WO | WO 99/18603 | 4/1999 |
| WO | WO 00/36635 | 6/2000 |
| WO | WO 01/10733 A1 | 2/2001 |
| WO | WO 01/22016 A1 | 3/2001 |
| WO | WO 01/33615 A3 | 5/2001 |
| WO | WO 01/55628 A1 | 8/2001 |
| WO | WO 01/68279 A2 | 9/2001 |
| WO | WO 01/74538 A1 | 10/2001 |
| WO | WO 01/78911 A1 | 10/2001 |
| WO | WO 01/85391 A2 | 11/2001 |
| WO | WO 01/94782 A3 | 12/2001 |
| WO | WO 02/09147 A2 | 1/2002 |
| WO | WO 02/16051 A2 | 2/2002 |
| WO | WO 02/084709 A2 | 10/2002 |
| WO | WO 03/030219 A2 | 10/2003 |

OTHER PUBLICATIONS

Sun, Y.P. et al., "Preparation of Polymer-Protected Semiconductor Nanoparticles Through the Rapid Expansion of Supercritical Fluid Solution," Chemical Physics Letters, pp. 585-588, May 22, 1998.

Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270-279, Oct. 21, 1997.

Xu, C. et al., "Submicron-Sized Spherical Yttrium Oxide Based Phosphors Prepared by Supercritical CO2-Assisted aerosolization and pryolysis," Appl. Phys. Lett., vol. 71, No. 12, Sep. 22, 1997, pp. 1643-1645.

Courtecuisse, V.G. et al., "Kinetics of the Titanium Isopropoxide Decomposition in Supercritical Isopropyl Alcohol," Ind. Eng. Chem. Res., vol. 35, No. 8, pp. 2539-2545, Aug. 1996.

Gallagher-Wetmore, P. et al., "Supercritical Fluid Processing: A New Dry Technique for Photoresist Developing," SPIE vol. 2438, pp. 694-708, Jun. 1995.

McHardy, J. et al., "Progress in Supercritical CO2 Cleaning," SAMPE Jour., vol. 29, No. 5, pp. 20-27, Sep. 1993.

Purtell, R, et al., "Precision Parts Cleaning using Supercritical Fluids," J. Vac, Sci, Technol. A. vol. 11, No. 4, Jul. 1993, pp. 1696-1701.

Hansen, B.N. et al., "Supercritical Fluid Transport—Chemical Deposition of Films,"Chem. Mater., vol. 4, No. 4, pp. 749-752, 1992.

Hybertson, B.M. et al., "Deposition of Palladium Films by a Novel Supercritical Fluid Transport Chemical Deposition Process," Mat. Res. Bull., vol. 26, pp. 1127-1133, 1991.

Ziger, D. H. et al., "Compressed Fluid Technology: Application to RIE-Developed Resists," AiChE Jour., vol. 33, No. 10, pp. 1585-1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298-2306, 1987.

Tolley, W.K. et al., "Stripping Organics from Metal and Mineral Surfaces using Supercritical Fluids," Separation Science and Technology, vol. 22, pp. 1087-1101, 1987.

Joseph L. Foszez, "Diaphragm Pumps Eliminate Seal Problems", Plant Engineering , pp. 1-5, Feb. 1, 1996.

Bob Agnew, "WILDEN Air-Operated Diaphragm Pumps", Process & Industrial Training Technologies, Inc., 1996.

* cited by examiner

APPARATUS AND METHOD OF SECURING A WORKPIECE DURING HIGH-PRESSURE PROCESSING

FIELD OF THE INVENTION

This invention relates to the field of processing chambers. In particular, this invention relates to an apparatus and a method of securing a workpiece undergoing high-pressure processing.

BACKGROUND OF THE INVENTION

Many systems exist for holding and securing a workpiece undergoing processing in a processing chamber. These systems have various drawbacks. First, these systems create a pressure differential between a top face and a bottom face of the workpiece. In high-pressure processing chambers, for example, these pressure differentials can cause the workpiece to suffer stress fractures or even to break. Second, these systems expose the workpiece to surfaces that can scratch or otherwise damage the workpiece. Third, these systems are not suitable for all processing environments. For example, these systems do not allow both the top and bottom faces of the workpiece to be processed.

Accordingly, what is needed is an apparatus and method of securing a workpiece undergoing processing, which minimizes the pressure differential between the top and bottom faces of a workpiece. What is also needed is an apparatus and method of securing a workpiece undergoing processing, which minimizes the probability that the workpiece is scratched or otherwise damaged. What is also needed is an apparatus and method of securing a workpiece undergoing processing, which allows the workpiece to be processed in a variety of ways.

BRIEF SUMMARY OF THE INVENTION

Embodiments of the present invention include a processing chamber having a first segment and a second segment for securing a workpiece undergoing processing in the processing chamber. In accordance with the present invention, a substantial portion of both the first face and the second face are exposed to a processing material introduced into the processing chamber.

In one embodiment, the first segment is configured to engage the workpiece at or near a top edge, and the second segment is configured to engage the workpiece at or near a bottom edge. In a further embodiment, the first segment is coupled to a top plate and the second segment is coupled to a bottom plate. When the top plate and the bottom plate are brought together, the first segment and the second segment secure the workpiece within a processing volume defined by the top plate and the bottom plate.

A further embodiment of the present invention comprises an inlet system and an outlet system, both coupled to the processing chamber. In one embodiment, the inlet system is configured to introduce the processing material into the processing chamber, substantially parallel to both the first face and the second face of the workpiece. The outlet system is configured to exhaust the processing material from the processing chamber, substantially parallel to both the first face and the second face of the workpiece. In this way, the processing material is drawn substantially across the first face and the second face, thus processing the first face and the second face.

DETAILED DESCRIPTION OF THE INVENTION

Embodiments of the present invention provide a holder that secures a workpiece in a processing chamber by contacting only a small portion of the workpiece. In one embodiment, the holder contacts the workpiece at or near an edge of the workpiece. In another embodiment, the holder contacts islands of the workpiece. The holder is configured to leave a substantial portion of both the upper face and the lower face of the workpiece exposed so that both faces can be treated with a processing material introduced into the processing chamber. By minimizing contact with the workpiece, the holder reduces the chance that the holder or particulates on it will scratch or otherwise damage the workpiece. Because a holder in accordance with the present invention mechanically securely supports the workpiece, it obviates the need for pumps, valve lines, and other equipment usually required for vacuum chucks and other holders.

The following discussions describe a processing chamber in a loading/unloading position, an intermediate position, and a processing position. In the loading/unloading position, a workpiece can be placed into or removed from the processing chamber. In the intermediate position, the workpiece is supported but not fully secured by a holder within the processing chamber. In the processing position, the workpiece is secured by the holder within the processing chamber. The processing chamber is sealed so that a processing material can be introduced into the processing chamber to process the workpiece.

Figure 1:
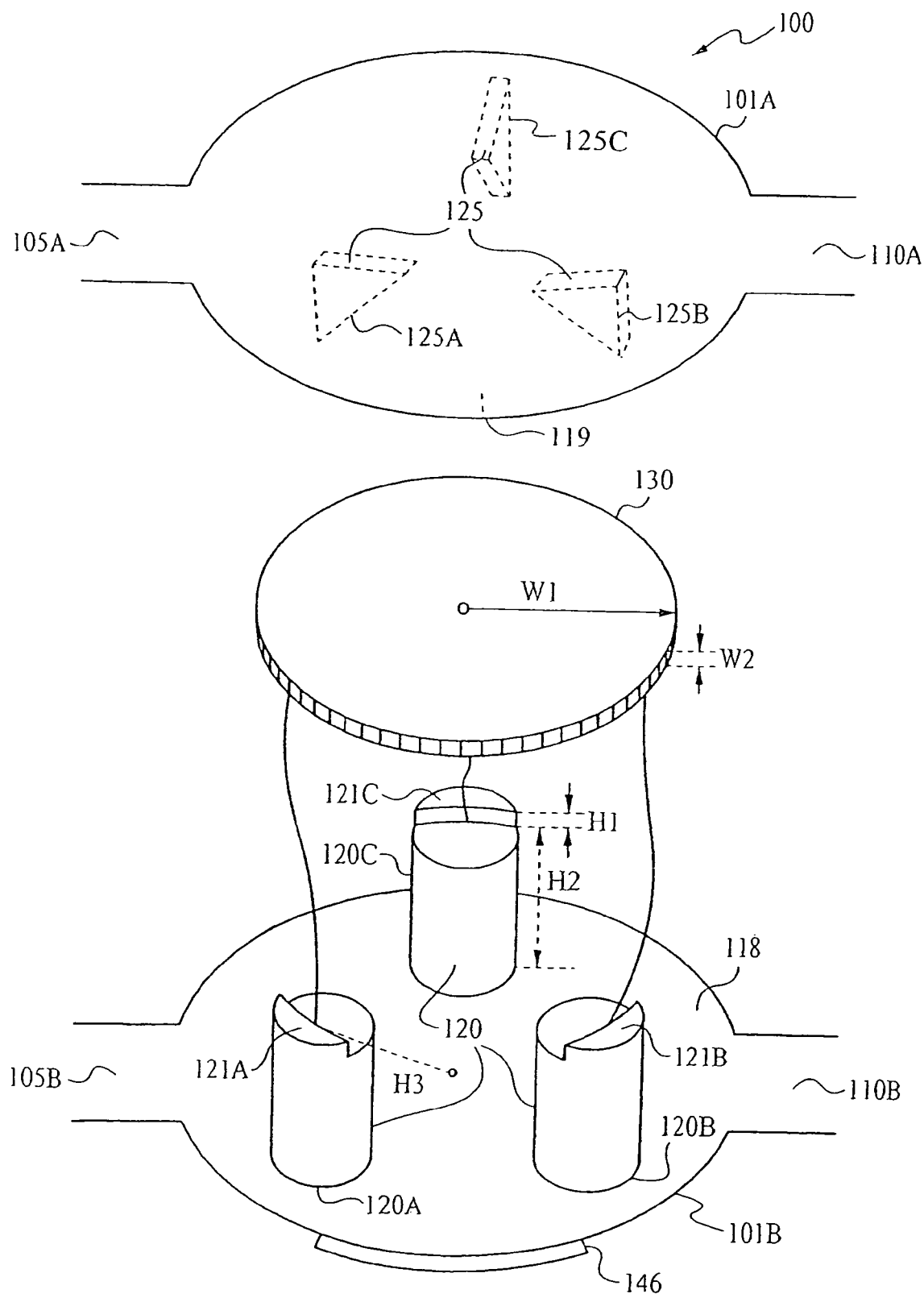
FIG. 1 is a schematic of a perspective exploded view of a processing chamber and a circular workpiece secured in the processing chamber, in accordance with one embodiment of the present invention.

FIG. 1 is a schematic perspective exploded view of a circular workpiece 130 and a processing chamber 100 for securing and processing the workpiece 130 in accordance with the present invention. The processing chamber 100 comprises a top plate 101A, a bottom plate 101B, and a heater 146 coupled to the bottom plate 101B. The top plate 101A comprises upper elements 125A-C, which together form an upper segment 125 of a holder 129 (FIG. 3). The upper elements 125A-C are outlined with broken lines (as seen from the perspective view) to indicate that they are coupled to an opposite, inner surface 119 of the top plate 101A. The top plate 101A also contains a top portion 105A of an inlet port (105, FIG. 3) and a top portion 110A of an outlet port 110 (FIG. 3). The inlet port 105 and the outlet port 110 are configured to introduce and remove processing materials into and out of the processing chamber 100. The inlet port (105, FIG. 3) can be part of an inlet system, which may, for example, comprise a pump (not shown) for introducing the processing materials into the processing chamber 100. The outlet port (110, FIG. 3) can be part of an outlet system, which may, for example, comprise a vacuum (not shown) for removing the processing materials from the processing chamber 100. Preferably, the inlet port 105 is configured to introduce processing materials into the processing chamber 100 substantially parallel to both a top face and a bottom face (130A and 130B, respectively, FIG. 2) of the workpiece 130. Also, preferably, the outlet port 110 is configured to remove the processing materials from the processing chamber 100 substantially parallel to both the top face and the bottom face (130A and 130B, respectively, FIG. 2) of the work piece 130.

Figure 2:
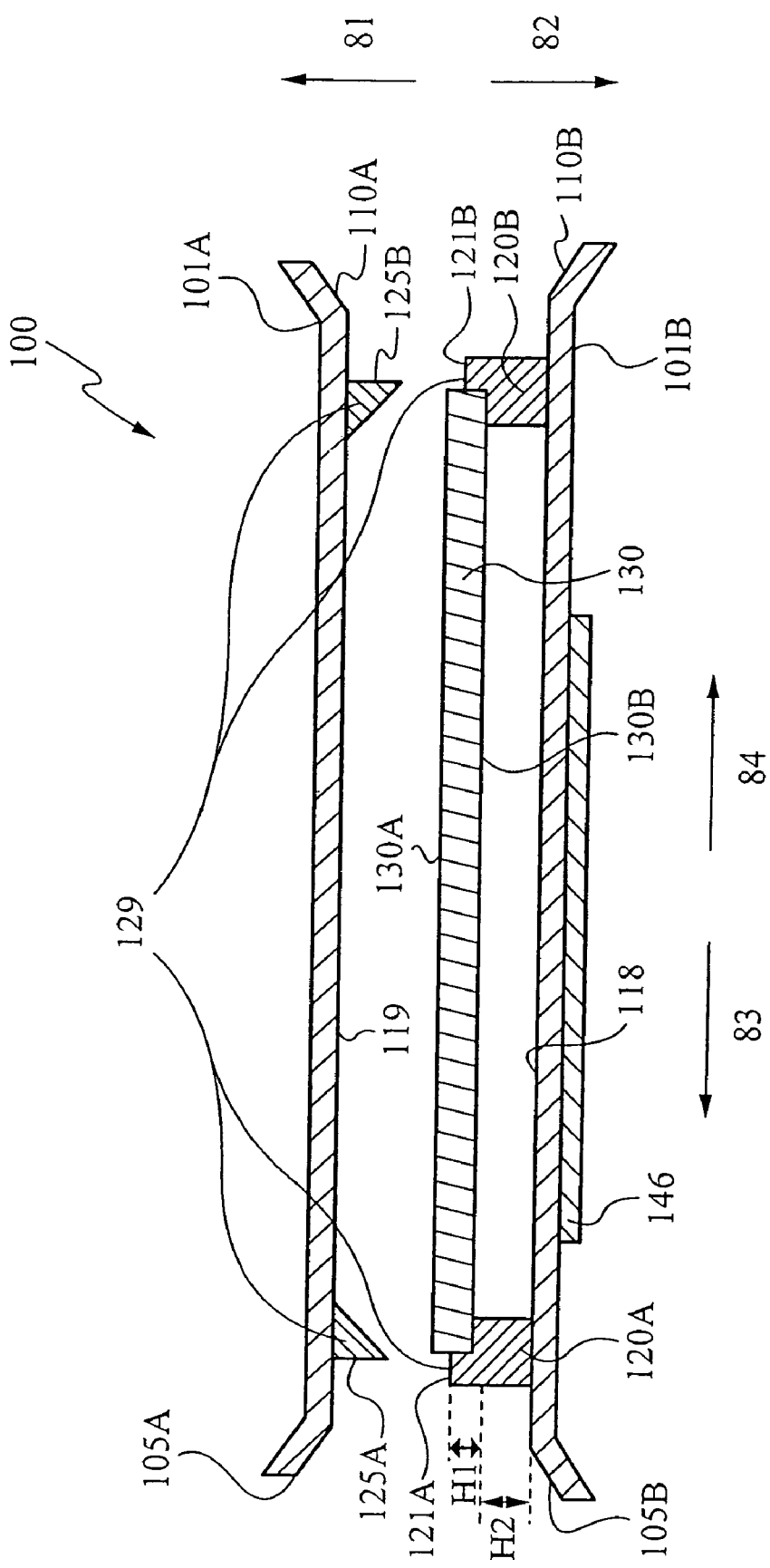
FIG. 2 is a schematic of a side cross-sectional view of the processing chamber and the circular workpiece of FIG. 1, when the processing chamber is in an intermediate position.
Figure 3:
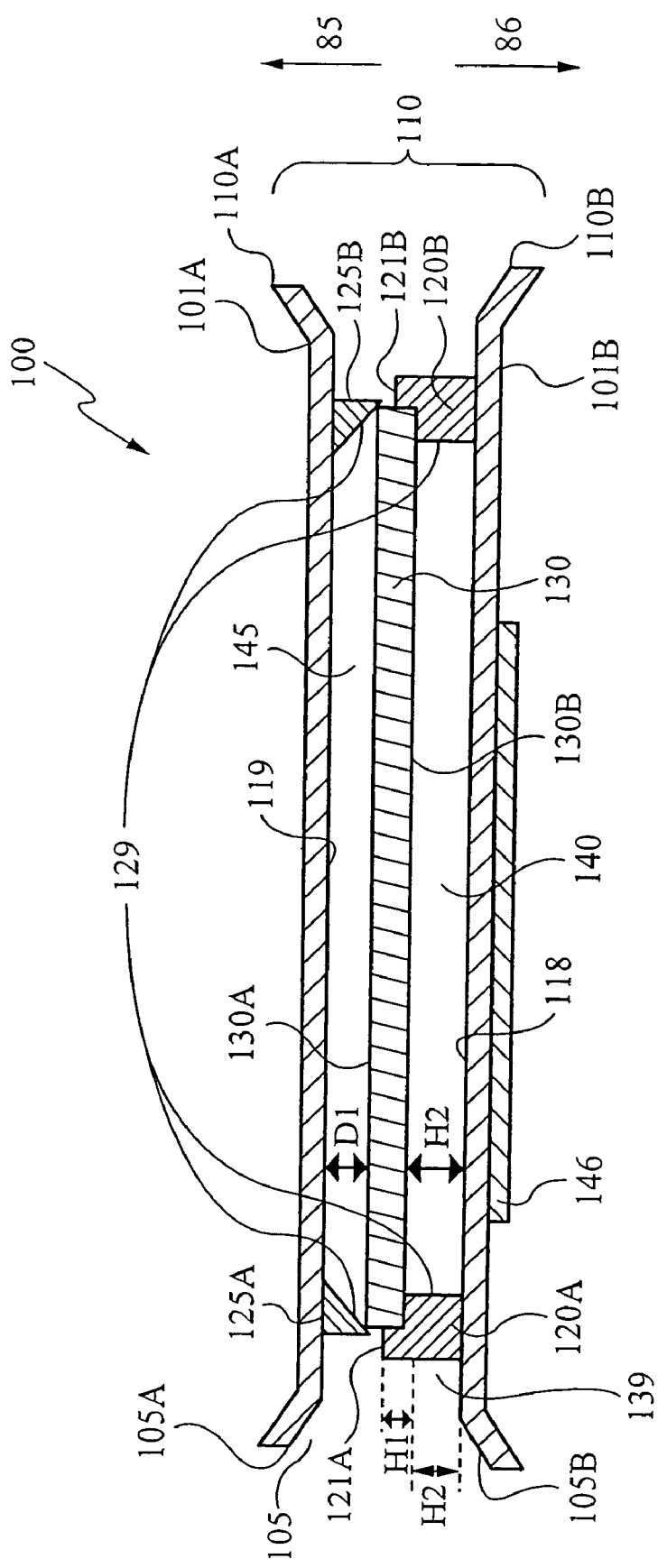
FIG. 3 is a schematic of a side cross-sectional view of the processing chamber and the circular workpiece of FIG. 1, when the processing chamber is in a processing position.

The bottom plate 101B comprises lower elements 120A-C, which together form a lower segment 120 of the holder 129 (FIG. 2). The lower elements 120A-C are coupled to an inner surface 118 of the bottom plate 101B. In a preferred embodiment, the lower elements 120A-G are arranged equidistant along the circumference of a circle centered on the bottom plate 101B. The bottom plate 101B also contains a bottom portion 105B of the inlet port 105 (FIG. 3) and a bottom portion 110B of the outlet port 110 (FIG. 3). When the top plate 101A is brought together with the bottom plate 101B to form a processing volume, the top portion 1015A and the bottom portion 105B together form the inlet port 105, and the top portion 110A and the bottom portion 110B together form the outlet port 110 (FIG. 3).

While the preferred embodiment has three upper elements 125A-C and three corresponding lower elements 120A-C, it will be appreciated that other numbers of elements can be used to achieve the present invention. For example, fewer than three or more than three upper elements and corresponding lower elements can be used to secure a workpiece in accordance with the present invention. It will also be appreciated that the number of upper elements need not equal the number of lower elements in order to practice the present invention.

Still referring to FIG. 1, each of the lower elements 120A-C has a recess, as exemplified by the lower element 120C, a distance H1 from a top surface 121A-C, respectively, of each of the lower elements 120A-C. Each of the recesses is also a distance H2 from the inner surface 118 of the bottom plate 101B. Thus, each of the lower elements 120A-C has a recessed portion, which all preferably lie substantially in a common plane parallel to the bottom plate 101B. As described below, when a bottom face of the workpiece 130 rests on the recessed portions of the lower elements 120A-C, the bottom face 130B of the workpiece will lie in a plane substantially parallel to and a distance H2 from the inner surface 118 of the bottom plate 101B.

FIG. 2 is a side cross-sectional view of the workpiece 130 resting on the lower elements 120A-B. FIG. 2 illustrates the processing chamber 100 in an intermediate position. As illustrated in FIG. 2, the workpiece 130 rests in the recesses of each of the lower elements 120A-B. Each of the recesses is shaped to substantially match the contour of an edge of the workpiece 130. A bottom surface of the recess of each of the lower elements 120A-C contacts an edge or shoulder of the workpiece 130 and thus supports the workpiece 130 in a direction indicated by the arrow 81. A side wall of each of the recesses in the lower elements 120A-C secures the workpiece 130 and prevents movement in the directions indicated by the arrows 83 and 84. It will be appreciated that while the lower element 120C is not illustrated in the side cross-sectional view of FIG. 2, the bottom element 120C also supports and secures the workpiece 130 in a manner similar to that of the lower elements 120A-B.

When the top plate 101B is moved in the direction indicated by the arrow 82 in FIG. 2, the processing chamber 100 is placed in a processing position, as illustrated in FIG. 3. As illustrated in FIG. 3, each of the top elements 125A-B contacts an edge or shoulder of the workpiece 130, securing the workpiece and preventing movement in the direction indicated by the arrow 85. It will be appreciated that while not illustrated in the side cross-sectional view of FIG. 3, the top element 125C also contacts the workpiece 130 at edges or shoulders of the workpiece 130, further securing the workpiece 130 from movement in the direction indicated by the arrow 85. FIG. 3 further illustrates that when the top plate 101A is moved in the direction indicated by the arrow 86, the top portion 110A and the bottom portion 110B form the outlet port 110, and the top portion 105A and the bottom portion 105B form the inlet port 105.

FIG. 3 illustrates several features of the present invention. First, the workpiece 130 is displaced from the inner surface 118 of the bottom plate 101B by the distance H2, and from an inner surface 119 of the top plate 101A by the distance D1. Further, when the processing chamber 100 is in the processing position, the inner surface 119 of the top plate 101A and the inner surface 118 of the bottom plate 101B define a portion of a processing volume 139. The processing volume 139 comprises an upper volume 145 and a lower volume 140. The upper volume 145 is defined between the inner surface 119 of the top plate 101A and a top face 130A of the workpiece 130. The lower volume 140 is defined between the inner surface 118 of the bottom plate 101B and a bottom face 130B of the workpiece 130.

As described in more detail below, in operation a processing material is introduced into the processing volume 139 through the inlet port 105. The processing material completely or partially fills the upper volume 145 and the lower volume 140. A portion of the processing material contained in the upper volume 145 processes the top face 130A of the workpiece 130. A portion of the processing material contained in the lower volume 140 processes the bottom face 130B of the workpiece 130. In one embodiment, the processing material is immediately exhausted from the processing volume 139 through the outlet port 110 and circulated back through the processing volume 139 through the inlet port 105, thus creating a process flow over the top face 130A and the bottom face 130B. Alternatively, the processing material can be exhausted from the processing volume 139 through the outlet port 110 at various times, in various manners, in accordance with the present invention.

The processing material processes the workpiece 130 by, for example, removing residue and other particulates from it, forming devices layers on it, or performing other processing steps on it. In a preferred embodiment, the processing material is a cleaning material such as carbon dioxide, used to clean one or more faces of the workpiece 130. Also in a preferred embodiment, the processing chamber 100 is configured to perform supercritical processing. Thus, for example, supercritical carbon dioxide is introduced into the processing volume 139 through the inlet port 105 to remove particulates, such as photoresist residue, from one or more faces of the workpiece 130. The supercritical $CO_2$ containing the particulates is then exhausted from the processing volume 139 through the outlet port 110. It will be appreciated that materials other than $CO_2$ can be used to clean the workpiece 130. It will also be appreciated that in accordance with the present invention, other processing materials can be introduced into the processing volume 139 and used to perform other processing steps on the workpiece 130. Furthermore, $CO_2$ can be introduced into the processing volume 139 and brought to a supercritical state once inside processing volume 139. The supercritical $CO_2$ can then be circulated within the processing volume 139 and later exhausted, as described above.

Because the bottom face 130B of the workpiece 130 is displaced from and thus does not contact the inner surface 118 of the bottom plate 101B, the bottom face 130B cannot be scratched or otherwise damaged by the bottom plate 101B or particulates residing on the bottom plate 101B. Furthermore, because the workpiece 130 is displaced from the inner surface 119 of the top plate 101A by the upper segment 125, the workpiece 130 cannot be scratched or otherwise damaged by the top plate 110A or particulates residing on the top plate 101A. At worst, the workpiece 130 can be scratched or damaged only where the top face 130A contacts the upper segment 125 and the bottom face 130B and contacts the lower segment 120. By ensuring that the bottom face 130B contacts the holder 129 only at places that do not form part of a finished workpiece, such as the device layers on a completed semiconductor wafer, the effect of any damage is minimized.

FIGS. 1-3 are labeled with dimensions W1, W2, H1, H2, and H3 to describe relative dimensions only, for one embodiment of the present invention. In one embodiment, the workpiece 130 has a radius W1 and a thickness W2. H1 is the distance between the top surfaces 121A-C of each of the lower elements 120A-C, respectively, and a corresponding recess on each of the lower elements 120A-C. H2 is the distance between the recess on each of the lower elements 120A-C and the inner surface 118 of the bottom plate 101B. H3 is the radius from a center of the bottom plate 101B and a sidewall of each of the lower elements 120A-C, each sidewall defined between the top surfaces 121A-C of each of the lower elements 120A-C, respectively, and the corresponding recess.

In one embodiment, the length H3 is slightly larger that the length W1, thus allowing the workpiece 130 to fit securely within the recesses of the bottom elements 120A-C. Further, in this embodiment, the length W2 is slightly larger than the length H1, thus allowing the workpiece 130 to extend slightly from the top surfaces 121A-C, allowing the top elements 125A-C to contact an edge of the workpiece 130 when the processing chamber 100 is in the processing position (FIG. 3). Further, in this embodiment, H2 is configured so that when the processing chamber is in the processing position (FIG. 3), a distance D1 between the top face 130A of the workpiece 130 is approximately equal to the distance H2, for the reasons explained below.

Again referring to FIG. 3, when the processing chamber 101 is in the processing position, both the upper volume 145 and the lower volume 140 contain a portion of the processing material when the workpiece 130 is being processed by the processing material. Preferably, the volume of the upper volume 145 is substantially equal to the volume of the lower volume 140. When the volume of the upper volume 145 is substantially equal to the volume of the lower volume 140, a pressure exerted on the top face 130A of the workpiece 130 during processing is substantially equal to a pressure exerted on the bottom face 130B of the workpiece 130. The two pressures counterbalance each other so that no significant stress is exerted on the workpiece 130. Thus, preferably, the values of D1 and H2 are substantially equal. It will be appreciated that these relative dimensions are for illustration of one embodiment only and do not limit the scope of the present invention. The relative dimensions can be other than those described here without departing from the scope of the present invention.

In a preferred embodiment, when the processing chamber 100 is in a processing position, each of the upper elements 125A-C is positioned opposite one each of the lower elements 120A-C. In this way, the stress exerted on the workpiece 130 by each of the upper elements 125A-D is advantageously offset by the stress exerted on the workpiece 130 by each of the lower elements 120A-C. Alternatively, the upper elements 125A-D can each be positioned to be slightly offset from one each of the lower elements 120A-C.

It will be appreciated that the inlet port 105 can be coupled to an injector system (not shown) used to inject the processing material into the processing volume 139 through the inlet port 105. Preferably, the injector system is a pressurized system that introduces processing materials under high pressure into the processing volume 139. Alternatively, the injector system comprises a pump. Similarly, the output port 110 can be coupled to a vacuum pump or another apparatus for removing the processing material from the processing volume 139 after processing of the workpiece 130 has completed.

While FIG. 1 illustrates the lower elements 120A-C having a circular recessed configuration and the upper elements 125A-C having a triangular, wedge-shaped cross section, the lower elements 120A-C and the upper elements 125A-C can have other shapes without departing from the present invention. For example, the upper elements 125A-C can have a rectangular cross section or a finger shape. Indeed, the upper elements 125A-C and the lower elements 120A-C can have any shape so long as they securely hold the workpiece 130 during processing and allow a substantial portion of both the top face 130A and bottom face 130B of the workpiece 130 to be exposed and thus processed. Here, a substantial portion can be that portion that must be exposed to the processing material. For example, if the workpiece 130 is to be processed to form an active region on a semiconductor device, a substantial portion can be that portion that must be exposed to the processing material to form the active region. If the workpiece 130 is to be processed to remove photoresist residue, a substantial portion is that portion from which the photoresist residue must be removed for the final device to be properly formed.

Figure 4:
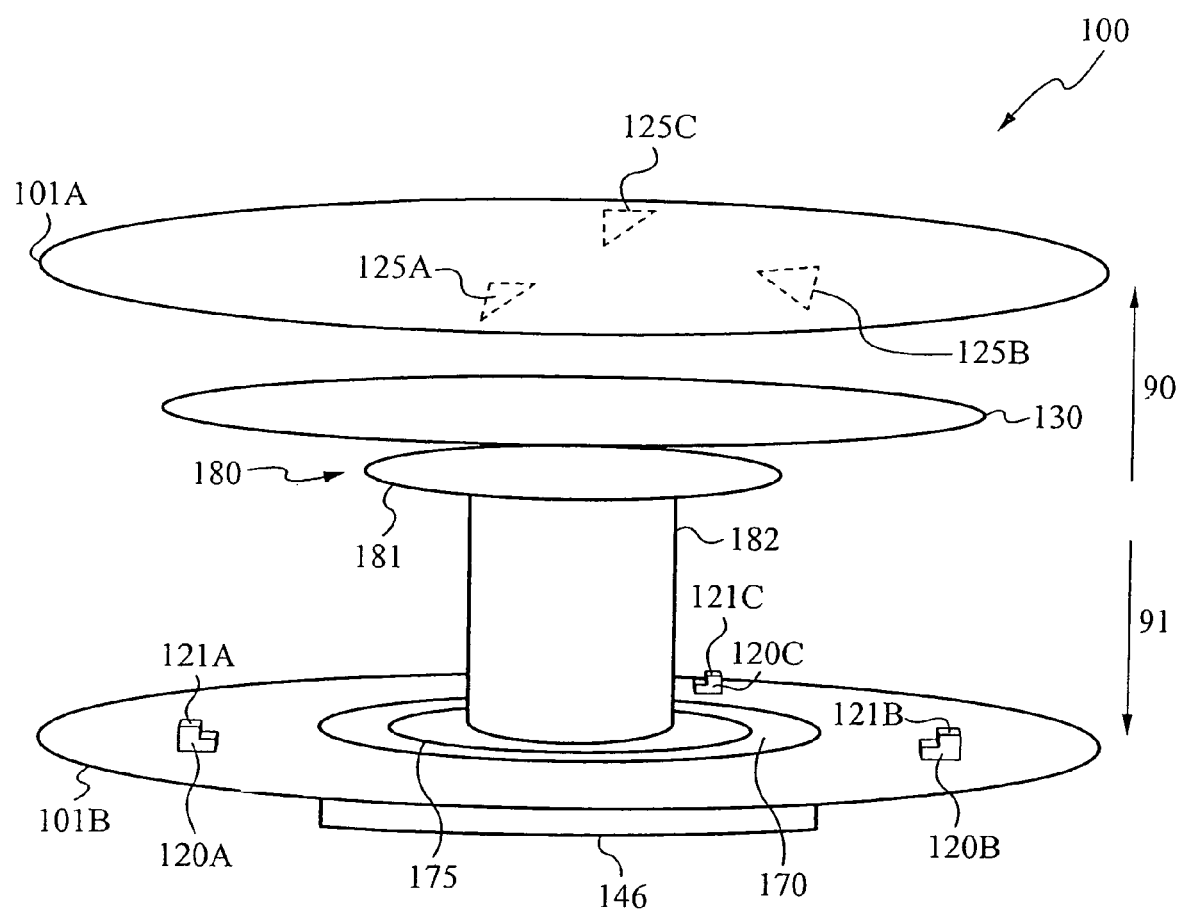
FIG. 4 depicts a side perspective view of a top plate, a bottom plate, a wafer pick, and a workpiece, in accordance with one embodiment of the present invention.

FIG. 4 illustrates the workpiece 130 and a partial, more detailed view of the processing chamber 100 of FIG. 1. FIG. 4 illustrates the processing chamber 100 in a loading/unloading position, in which the workpiece 130 can be inserted into or removed from the processing chamber 100. In addition to those elements depicted in FIG. 1, FIG. 4 depicts a wafer pick 180, used, as described in more detail below, to insert the workpiece 130 into and remove the workpiece 130 from the lower elements 120A-D. The wafer pick 180 comprises a piston 182 coupled to a pedestal 181 configured to support the workpiece 130. The bottom plate 101B has an inner depression 170 and is configured to allow the piston 182 to move through a central portion of the bottom plate 101B. The inner depression 170 contains an o-ring and o-ring groove pair 175. The inner depression 170 is configured to contain the pedestal 181 such that when the pedestal 181 is flush with an inner surface of the bottom plate 101B, the pedestal 181 and the inner surface of the bottom plate 101B form a hermetically-sealed surface through the o-ring and o-ring groove 175 that helps define a sealed processing volume.

Preferably, the elements contained within the processing volume (139, FIG. 3) (including an inner surface of the top plate 101A, an inner surface of the bottom plate 101B, the pedestal 181, the upper elements 125A-C, and the lower elements 120A-C) are all made from one or more materials that can withstand the processing material, processing temperatures, and processing pressures used to process the workpiece 130. In one embodiment, the inner surface of the top plate 101A, the inner surface of the bottom plate 101B, the pedestal 181, the upper elements 125A-C, and the lower elements 120A-C, all comprise stainless steel. Alternatively, the above elements can comprise other materials that can withstand the processing material, the processing temperature, and the processing pressures used to process the workpiece 130.

Again referring to FIG. 4, in use, the workpiece 130 is placed on the pedestal 181 by a robot arm (not shown) or by an operator. Next, the wafer pick 180 is moved in the direction indicated by the arrow labeled 91 until the pedestal 181 is flush with the inner surface of the bottom plate 101B. The pedestal 181 and the inner surface of the bottom plate 101B now form a hermetically-sealed surface, which forms part of the processing volume (139, FIG. 3) within which the workpiece 130 is processed. As described below, the processing chamber 100 is now in an intermediate position.

Because the lower elements 120A-C project from the inner surface 118 of the bottom plate 101B, when the pedestal 181 is approximately flush with a recess in each of the lower elements 120A-C, the workpiece 130 contacts each of the lower elements 120A-C and is supported by them. Thus, when the pedestal 181 is approximately flush with the inner surface 118 of the bottom plate 101B, a hermetically-sealed lower volume (140, FIG. 3) exists between the lower face 130B of the workpiece 130 and the inner surface 118 of the bottom plate 101B.

Referring now to FIG. 2, the workpiece 130 is supported at or near an edge by the lower elements 120A-C. Thus, the workpiece 130 is secured in the direction of the arrow 81 by each of the lower elements 120A-C and secured in a horizontal plane, in the direction of the arrows 83 and 84, by the recesses in the lower elements 120A-C. It will be appreciated that other configurations of the holder 129 can be used to secure the workpiece 130 in accordance with the present invention. For example, the lower segment 120 can secure the workpiece using fewer than or more than the three elements 120A-C depicted in FIG. 4.

Again referring to FIG. 4, the top plate 101A is next moved in the direction indicated by the arrow 91 until the upper elements 125 contact an edge of the workpiece 130, as illustrated in FIG. 3. The processing chamber 101 is now in the processing position, as illustrated in FIG. 3. The workpiece 130 is now secured by the holder 129 so that a substantial portion of both the top face 130A and the bottom face 130B of the workpiece 130 are exposed. A processing material can now be introduced into the inlet port (105, FIG. 3) to process the exposed portions of the top face 130A and the bottom face 130B of the workpiece 130.

When the workpiece 130 has been processed, any processing material contained in the processing volume (139, FIG. 3) is exhausted from or circulated through the processing chamber 100 through the outlet port 110 (FIG. 3). Again referring to FIG. 4, when processing is complete, the top plate 101A is moved in the direction indicated by the arrow 90, and the pedestal 181 is moved in the direction indicated by the arrow 90. The pedestal 181 contacts the workpiece 130 and lifts it clear of the lower elements 120A-C. The processing chamber 100 is again in the loading/unloading position depicted in FIG. 4. The workpiece 130 can now be removed from the pedestal 181 by a robot arm (not shown) or by an operator and replaced with a new workpiece to be processed.

It will be appreciated that lower elements such as those depicted in FIG. 1 can be positioned in other configurations in accordance with the present invention. For example, the lower elements can be coupled to an upper plate, such as upper plate 101A depicted in FIG. 1. A workpiece can be lifted and supported in a first vertical direction by support arms coupled to a lower plate. The support arms can engage the workpiece and raise it so that the workpiece is engaged and thus secured by the lower elements coupled to the top plate. The support arms can, for example, engage the workpiece in notches formed on a bottom surface of the workpiece. Of course, the workpiece can be engaged and secured using other methods.

Figure 5:
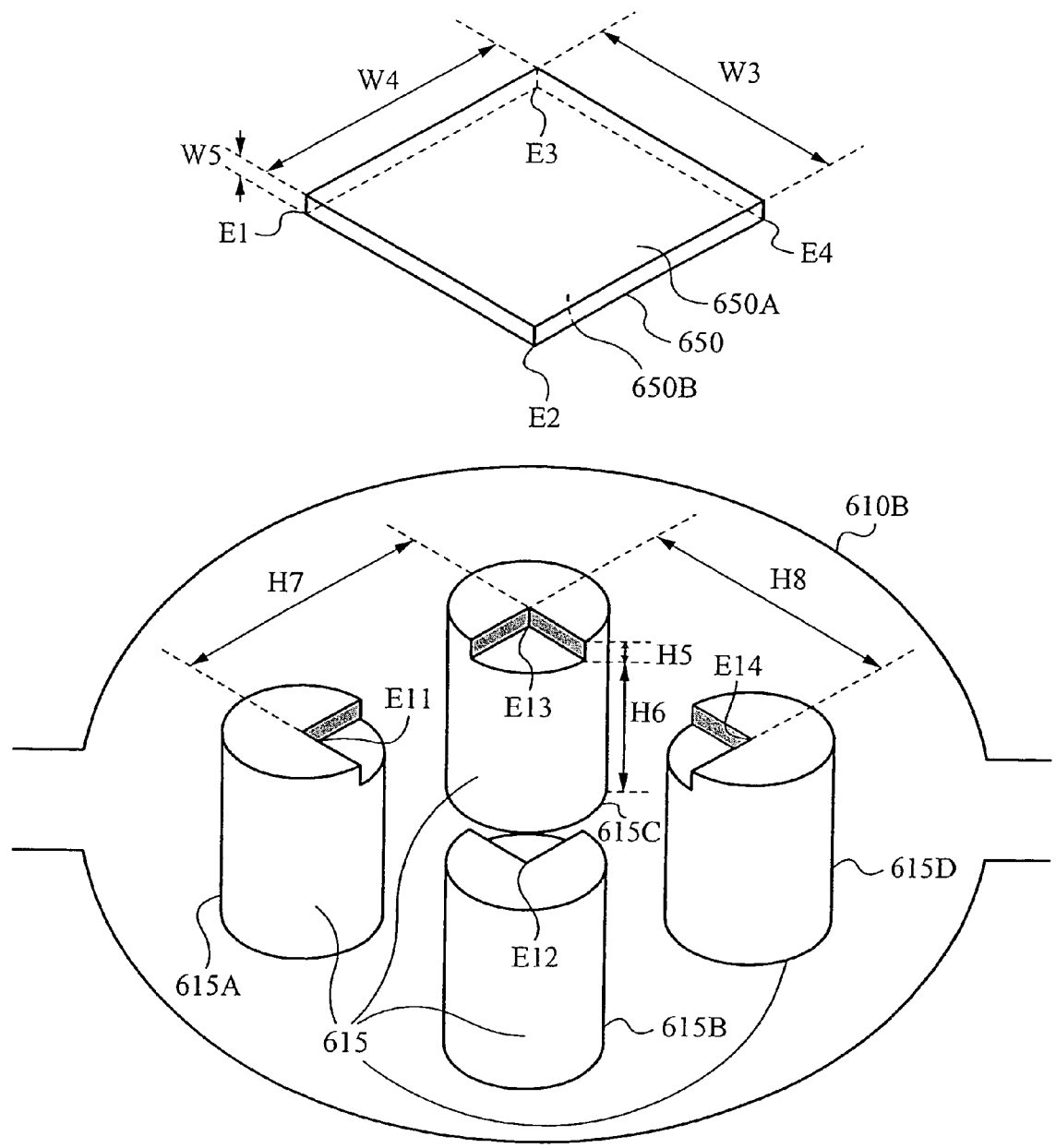
FIG. 5 is a schematic of a perspective exploded view of a workpiece and a bottom plate, in accordance with one embodiment of the present invention.

It will be also appreciated that the present invention is not limited to securing workpieces having circular shapes. Indeed, workpieces having various shapes can be secured in accordance with the present invention. FIG. 5, for example, illustrates a square-shaped workpiece 650 having a top face 650A and a bottom face 650B and secured in accordance with the present invention. The workpiece 650 is supported by the lower elements 615A-D coupled to a bottom plate 610B. It will be appreciated that a processing chamber comprising the bottom plate 610B will further comprise a top plate, similar to the top plate 101A shown in FIG. 1. The lower elements 615A-D form a lower segment 615 of a holder. Shaded portions of the lower elements 615A-D depict sidewalls defining recesses in the surface of each of the lower elements 615A-D. As illustrated in FIG. 5, the recesses are matched to the contour of the outer edges of the workpiece 650. In this way, the lower elements 615A-D secure the workpiece 650 from movement in a horizontal plane containing the lower elements 615A-D.

FIG. 5 is labeled with dimensions W3, W4, W5, H5, and H6 to describe relative dimensions only, for one embodiment of the present invention. In one embodiment, the workpiece 650 has a length W3, a width W4, and a thickness W5. Edges of the workpiece are labeled E1-4. Each of the lower elements 615A-D has a recessed surface a distance H5 from a top surface. Each of the recessed surfaces is a distance H6 from an inner surface of the bottom plate 610B. Each of the lower elements 615A-D has two sidewalls connecting the upper surface to the recessed surface. The sidewalls of the lower element 615A meet at the point E1, the sidewalls of the lower element 615B meet at the point E12, the sidewalls of the lower element 615C meet at the point E13, and the sidewalls of the lower element 615D meet at the point E14. Parallel sidewalls of the lower elements 615A and 615C are a distance H7 apart, as are parallel sidewalls of the lower elements 615B and 615D. Parallel sidewalls of the lower elements 615A and 615B are a distance H8 apart, as are parallel sidewalls of the lower elements 615C and 615D.

In one embodiment, the workpiece 650 is placed in the lower segment 615 so that the edge E1 approximately fits into the point E11, the edge E2 approximately fits into the point E12, the edge E3 approximately fits into the point E13, and the edge E4 approximately fits into the point E14. In this embodiment: the length H8 is slightly larger that the length W3, and the length H7 is slightly larger than W4, thus allowing the workpiece 650 to fit securely within the recesses of the bottom elements 615A-D. Further, in this embodiment, the length W5 is slightly larger than the distance H5, thus allowing the workpiece 650 to extend slightly from the top surface of each of the lower elements 615A-D. It will be appreciated that these relative dimensions are for illustration of one embodiment only and do not limit the scope of the present invention. The relative dimensions can be other than those described here without departing from the scope of the present invention.

Figure 6:
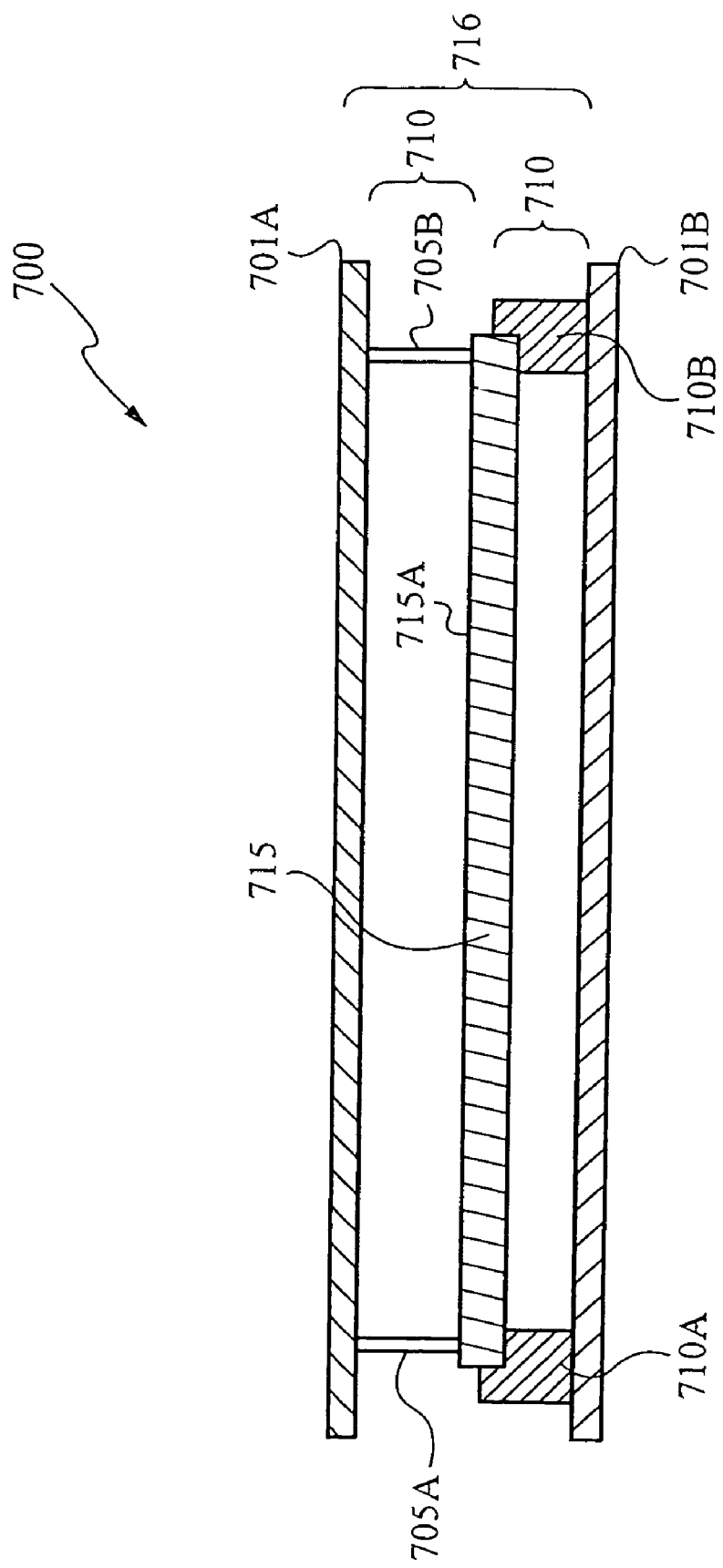
FIG. 6 is a side cross-sectional view of a processing chamber securing a workpiece, in accordance with one embodiment of the present invention.

FIG. 6 illustrates that a workpiece can be secured in positions other than at or near an edge, in accordance with embodiments of the present invention. FIG. 6 illustrates a cross sectional schematic of a processing chamber 700 in which a workpiece 715 is secured. The workpiece 715 has a top face 715A. The processing chamber 700 comprises an upper plate 701A and a lower plate 701B. Upper elements 705A-B are coupled to the upper plate 701A and form an upper segment 705 of a holder 716. The lower elements 710A-B are coupled to the lower plate 701B and form a lower segment 710 of the holder 716. The upper elements 705A-B and the lower elements 710A-B together secure the workpiece 715 within the processing chamber 700. It will be appreciated that in practice, the upper segment 705 will contain more elements than the two elements 705A-B and the lower segment 710 will contain more than the two elements 710A-B depicted in the cross-sectional drawing of FIG. 6. As illustrated in FIG. 6, the upper elements 705A-B secure the workpiece 715 by contacting it on an outer shoulder of the top face 715A of the workpiece 715.

Figure 7:
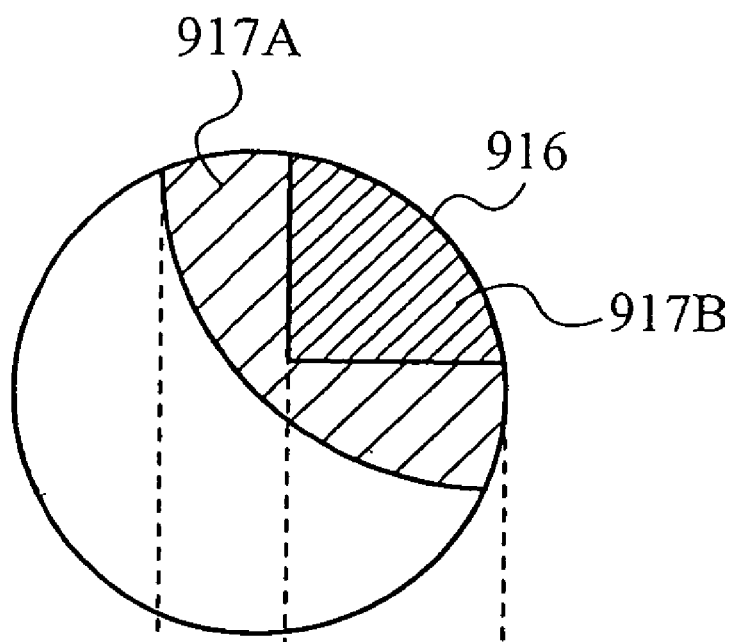
FIGS. 7 and 8 are a top view and a side cross-sectional view, respectively, of one bottom element of a holder, configured to secure two workpieces having two different configurations at different times.
Figure 8:
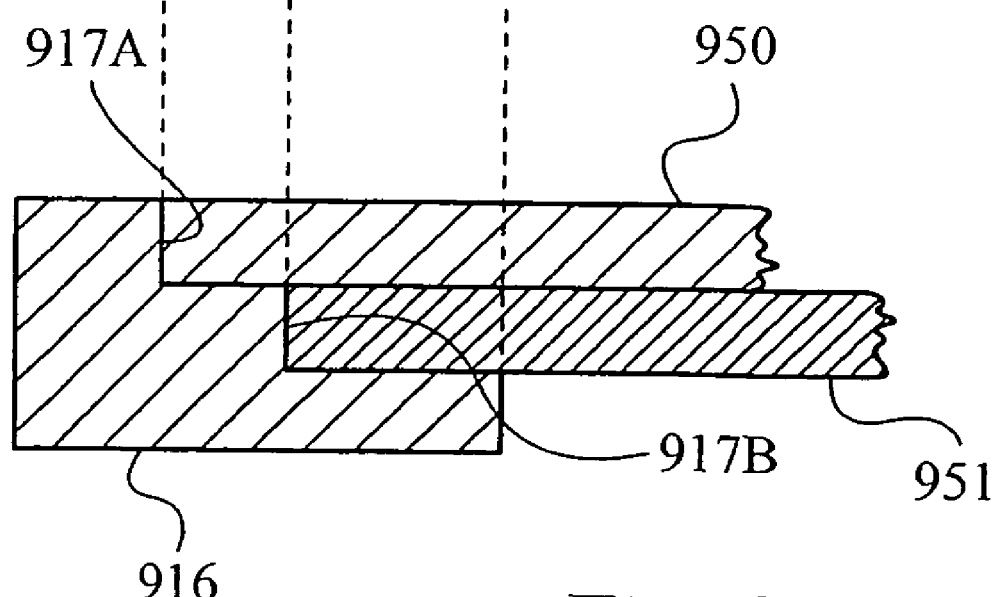

FIGS. 7 and 8 illustrate that lower elements can be configured to support and secure different workpieces having different configurations. As used here, the term configuration is used to define a shape and size of a workpiece. For example, FIG. 7 is a top view of a lower element 916 having a stepped configuration. The lower element 916 has a first configured recess 917A, which contains a second configured recess 917B. The first configured recess 917A is configured to receive and secure a first workpiece with a first configuration. The second configured recess 917B is configured to receive and secure a second workpiece with a second, different configuration.

FIG. 8 is a side cross-sectional view of the lower element 916, supporting and securing a first workpiece 950 and a second workpiece 951. It will be appreciated that FIG. 8 illustrates the two workpieces 950 and 951 simultaneously supported by the lower element 916 for illustration only. Preferably, only one of the workpieces 950 and 951 will be supported by the lower element 916 at one time. It will also be appreciated that FIGS. 7 and 8 illustrate only one lower element 916. Preferably, the lower element 916 will be paired with other lower elements to secure a workpiece, as illustrated, for example, in FIG. 1.

Figure 9:
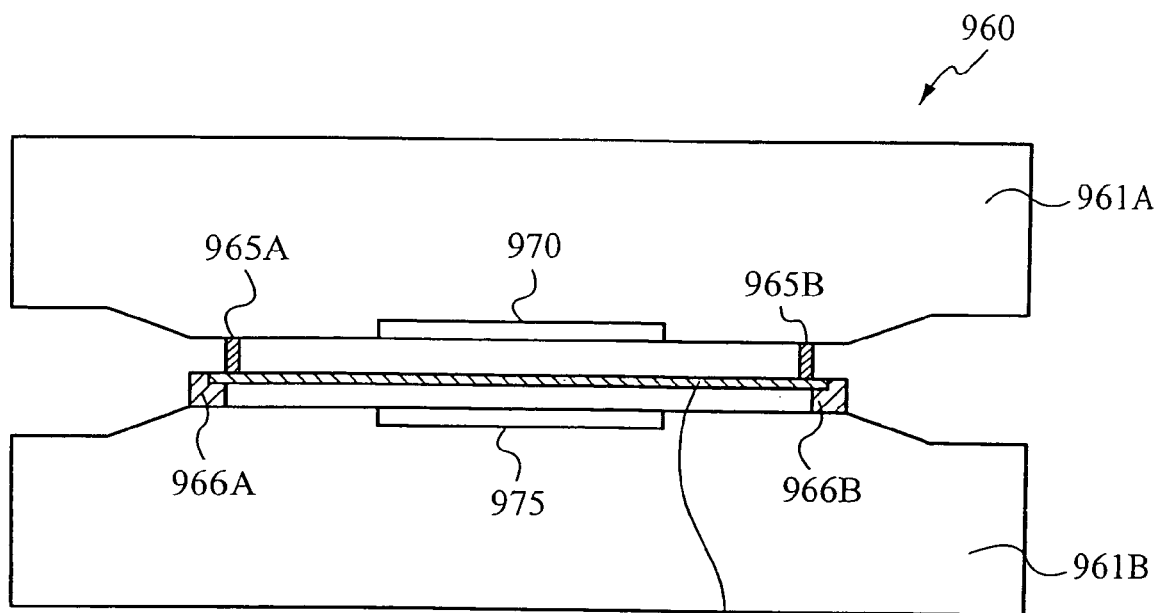
FIG. 9 is a side cross-sectional view of a processing chamber having two heaters, in accordance with one embodiment of the present invention.

FIG. 9 illustrates a processing chamber 960 in accordance with yet another embodiment of the present invention. The processing chamber 960 comprises a top plate 961A, a bottom plate 961B, an upper segment 965 comprising upper elements 965A-B, a lower segment 966 comprising lower elements 966A-B, a first heater 970 and a second heater 975. As described above in relation to, for example, FIG. 1, the upper elements 965A-B are coupled to the top plate 961A and the lower elements 966A-B are coupled to the bottom plate 961B. The first heater 970 is coupled to the top plate 961A and the second heater 975 is coupled to the bottom plate 961B. It has been found that when a holder displaces a workpiece from both a top plate and a bottom plate of a processing chamber, a processing material introduced into the processing chamber can be brought to high pressures and temperatures more efficiently by using two heaters as illustrated in FIG. 9.

Figure 11:
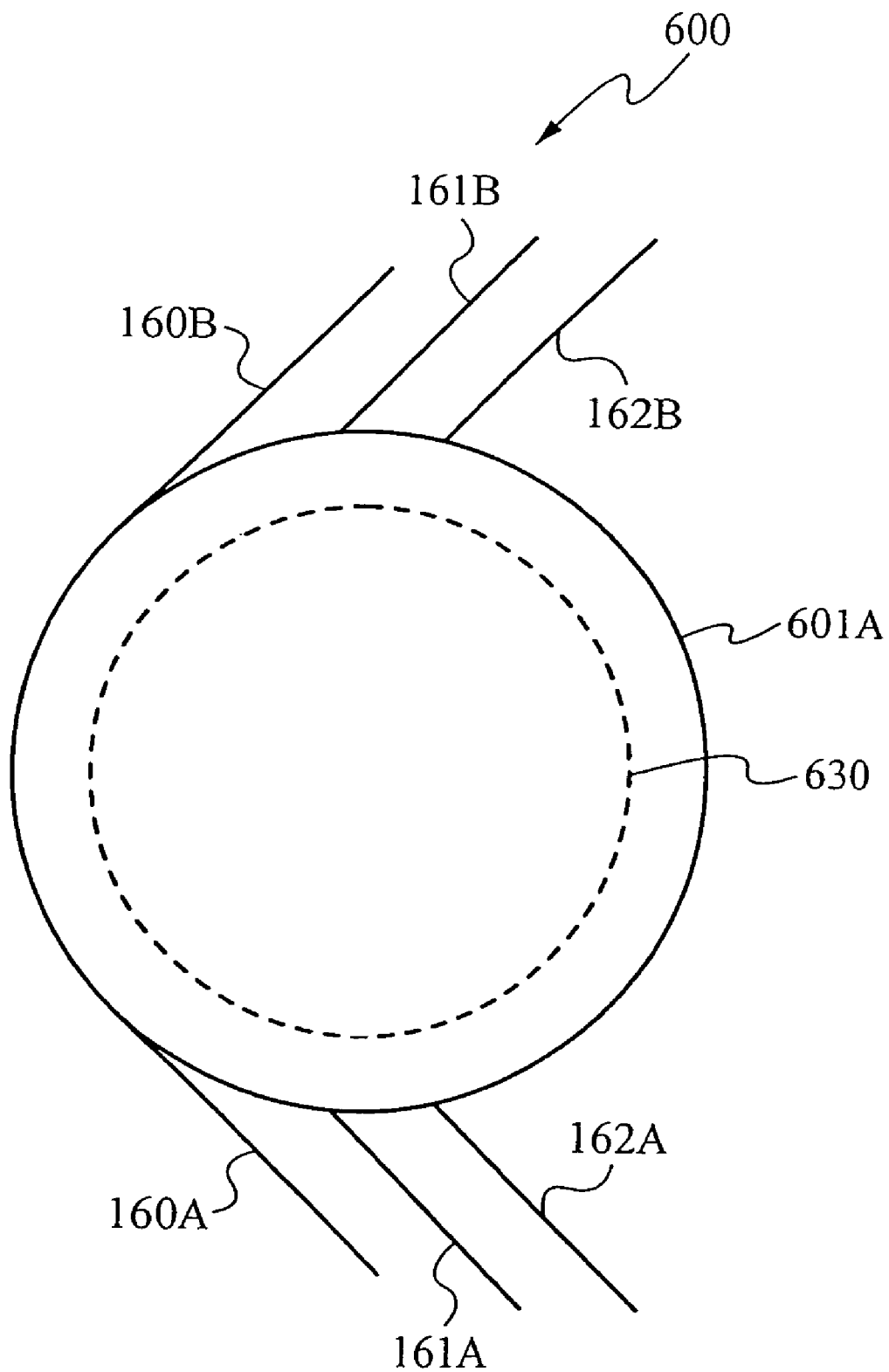
FIG. 11 is an illustration of a top view of a top plate with input ports and corresponding output ports, in accordance with a further embodiment of the present invention.
Figure 12:
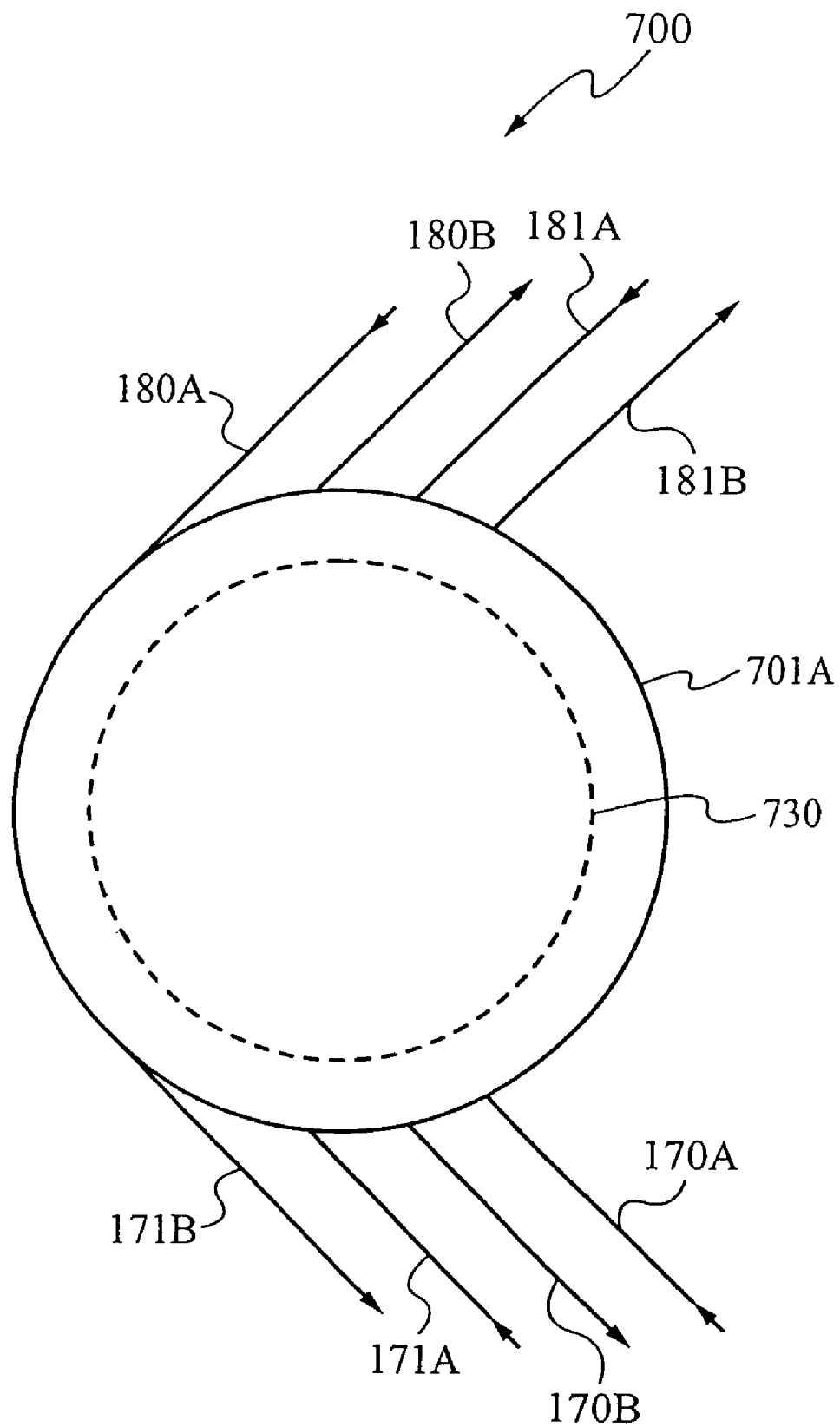
FIG. 12 is an illustration of a top view of a top plate with input ports and corresponding output ports, in accordance with a further embodiment of the present invention.

Inlet ports and outlet ports can be arranged in many configuration in accordance with the present invention. Some examples of different configurations of inlet ports and outlet ports are illustrated in FIGS. 10-12.

Figure 10:
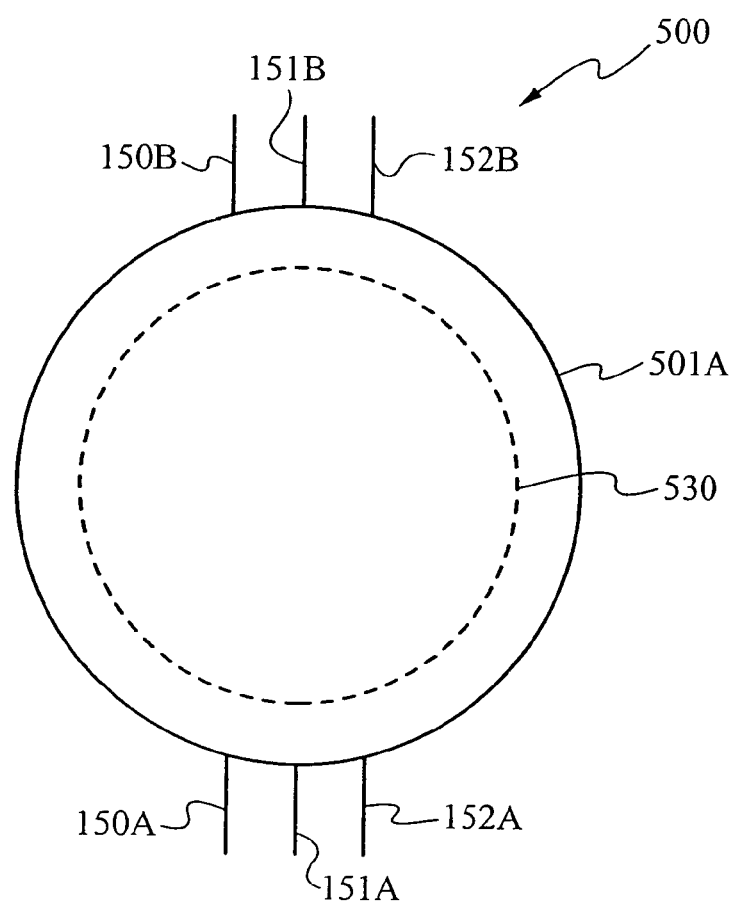
FIG. 10 is an illustration of a top view of a top plate with input ports and corresponding output ports, in accordance with one embodiment of the present invention.

FIG. 10 illustrates a top view of a portion of a processing system 500. The portion of the processing system 500 comprises a top plate 501A having inlet ports 150A, 151A, and 152A, and corresponding outlet ports 150B, 151B, and 152B, all aligned substantially parallel to each other and all aligned perpendicular to a circumference of the top plate 501A. FIG. 10 also illustrates a workpiece 530, with the broken lines of the workpiece 530 indicating that the workpiece 530 is contained within a processing chamber formed, in part, by the top plate 501A. It will be appreciated that each inlet port is coupled with an injector system, such as a pump, that injects the processing material into a processing volume during device processing. Similarly, each outlet port is coupled to an exhaust system, such as a vacuum pump, for exhausting the processing material from the processing volume during or after the workpiece has undergone processing.

As illustrated in FIG. 10, each inlet port has a paired outlet port configured diametrically opposite it. For example, the inlet port 150A has its corresponding outlet port 150B configured diametrically opposite it on an annular inner portion of the top plate 501A. It will be appreciated that while FIG. 10 depicts three pairs of inlet ports and exhaust ports, 150A-B, 151A-B, and 152A-B, more than three and less three pairs of inlet ports and outlet ports can be used in accordance with the present invention. Moreover, it will be appreciated that there need not be a corresponding number of inlet ports and outlet ports. There could be more inlet ports than outlet ports or fewer inlet ports than outlet ports. For example, there could be five inlet ports and two outlet ports.

It will also be appreciated that inlet ports and outlet ports can be positioned at locations other than the top plate 501A. For example, the inlet ports and outlet ports can be located on a bottom plate, on both a bottom plate and a top plate, or elsewhere in a processing system.

FIG. 11 illustrates a top view of a portion of a processing system 600. The portion of the processing system 600 comprises a top plate 601A having inlet ports 160A, 161A, and 162A, and corresponding outlet ports 160B, 161B, and 162B. Each inlet port and outlet port is aligned substantially non-perpendicular to a circumference of the top plate 601A. FIG. 11 also illustrates a workpiece 630, with the broken lines of the workpiece 630 indicating the workpiece 630 is contained within a processing chamber formed, in part, by the top plate 601A.

FIG. 12 illustrates an embodiment of a portion of another processing system 700 in accordance with another embodiment of the present invention. The processing system comprises a top plate 701A, inlet ports 170A, 171A, 180A, and 181A, and outlet ports 170B, 171B, 180B, and 181B. In FIG. 12, each inlet port is configured adjacent to a corresponding outlet port. For example, the inlet port 170A is configured adjacent to a corresponding outlet port 170B; the inlet port 171A is configured adjacent to a corresponding outlet port 171B; the inlet port 180A is configured adjacent to a corresponding outlet port 180B; and the inlet port 181A is configured adjacent to a corresponding outlet port 181B. Similar to the processing system 600 in FIG. 11, in the embodiment illustrated in FIG. 12, each inlet port and outlet port is aligned at a non-perpendicular angle to the circumference of the top plate 701A.

Inlet ports and outlet ports are taught generally in U.S. patent Ser. No. 10/121,791, titled "High Pressure Processing Chamber for Semiconductor Substrate Including Flow Enhancing Features," and filed Apr. 10, 2002, which is hereby incorporated by reference in its entirety.

Inlet ports and outlet ports, such as those illustrated in FIGS. 10-12, can be configured with other structures to introduce processing materials into and remove processing materials from processing volumes in a variety of ways. In accordance with embodiments of the present invention, inlet ports and outlet ports can be used with dispenser rings, collector rings, or both. Dispenser rings advantageously allow a larger amount of processing material to be uniformly introduced into a processing volume to process a workpiece. Collector rings advantageously allow the processing material to be uniformly removed from the processing volume after or while a workpiece is being processed.

Figure 13:
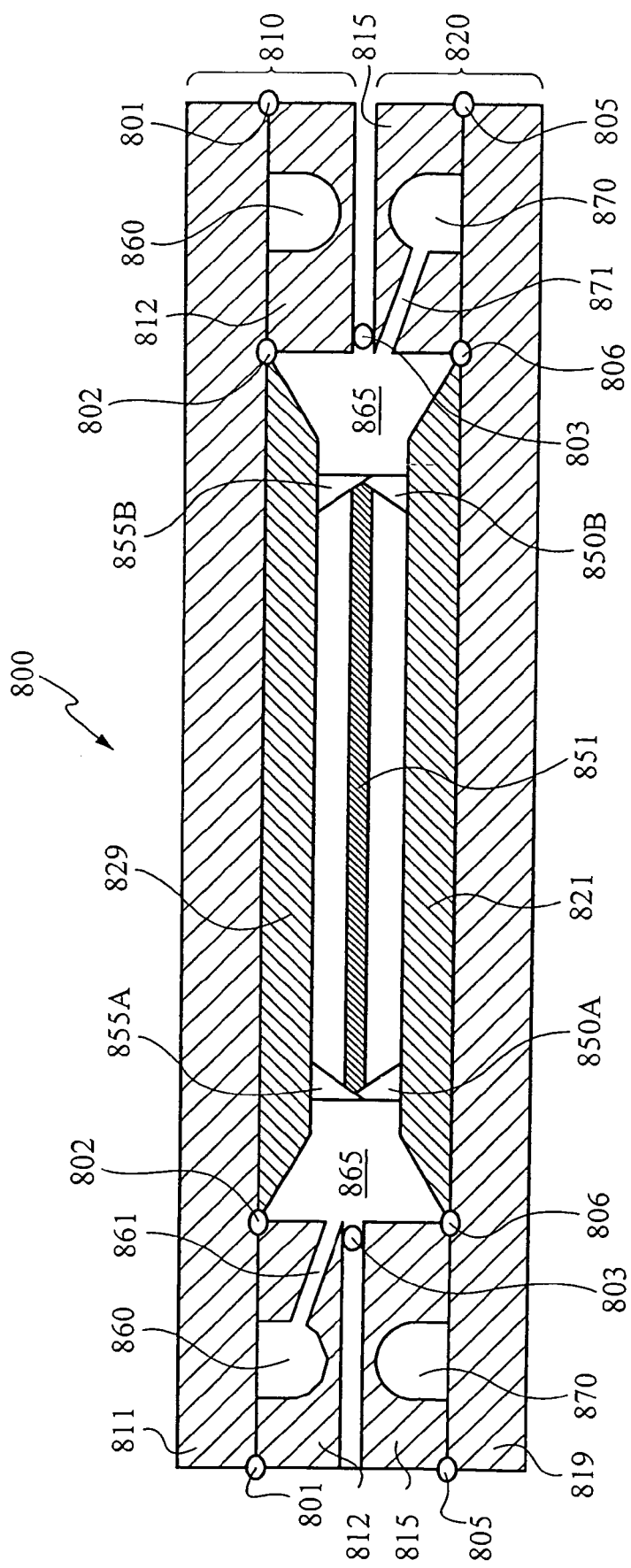
FIG. 13 is a side cross-sectional view of a processing chamber having a dispenser ring and a collector ring, in accordance with a further embodiment of the present invention.

FIG. 13 is a side cross-sectional view of a processing chamber 800 having a dispenser ring 860 and a collector ring 870. The processing chamber 800 comprises a top section 810 and a bottom section 820, which, when brought together, form a processing volume 865 containing a workpiece 851. The top section 810 comprises a top plate 811, a ringed plate 812 coupled to the top plate 811, a heater 829 coupled to the top plate 811, upper elements 855A and 855B of a holder coupled to the heater 829, and sealing elements 801, 802, and 803. The ringed plate 812 contains a dispenser ring 860, and channels (e.g., inlet ports) 861 and 862-864 (FIG. 14) coupling the dispenser ring 860 to the processing volume 865. The dispenser ring 860 can be coupled to a supply vessel (not shown), such as a $CO_2$ supply vessel.

The bottom section 820 comprises a ringed plate 815 coupled to a bottom plate 819, a heater 821 coupled to the bottom plate 819, lower elements 850A and 850B of the holder coupled to the heater 821, and sealing elements 805 and 806. The ringed plate 815 comprises a collector ring 870, and channels (e.g., outlet ports) 871 and 872-874 (FIG. 15) coupling the collector ring 870 to the processing volume 865. The collector ring 870 can be coupled to a collection vessel (not shown) used to store exhausted processing materials. It will be appreciated that the holder generally contains more than two upper elements 855A and 855B and more than two lower elements 850A and 850B, although only two upper elements and two lower elements are shown in the cross-sectional view of FIG. 13. The holder comprising the upper elements 855A and 855B and the lower elements 850A and 850B can have a structure similar to that of the holder 129 illustrated, for example, in FIG. 3. Thus, when securing the workpiece 851, the upper elements 855A and 855B and the lower elements 850A and 850B allow the workpiece 851 to be exposed at both a first and a second face to a processing material introduced into the processing volume 865.

Figure 14:
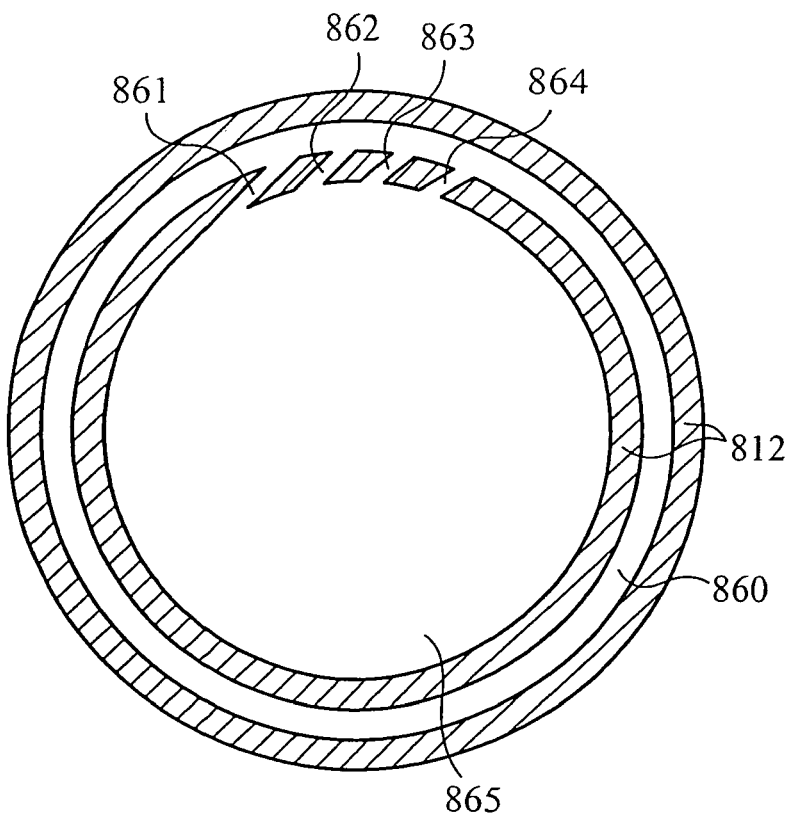
FIG. 14 is a top cross-sectional view of the processing chamber of FIG. 13, with the top plate removed, illustrating channels coupling the dispenser ring to a processing volume.

FIG. 14 is a top cross-sectional view of the processing chamber 800, with the top plate 811, the heater 829, and the upper elements 855A and 855B removed. FIG. 14 illustrates the channels 861-864 coupling the dispenser ring 860 to the processing volume 865. The channels 861-864 can be aligned along a circumference of the dispenser ring 860 in many ways. FIG. 14 shows the channels 861-864 aligned along a circumference of the dispenser 860 in a manner similar to that of the inlet ports 160A, 161A, and 162A illustrated in FIG. 11. It will be appreciated that the channels 861-864 can be configured in other ways in accordance with the present invention. For example, the channels 861-864 can be configured as are the inlet ports 150A, 151A, and 152A illustrated in FIG. 10. Alternatively, the channels 861-864 can be configured as are the inlet ports 170A, 171A, and 180A illustrated in FIG. 12. As illustrated in FIG. 14, the dispenser ring 860 traces a complete circle around an inner circumference of the ringed plate 812. It will be appreciated that in accordance with the present invention, the dispenser ring 860 can have other shapes, such as a partial ring that does not trace a complete circle around an inner circumference of the ringed plate 812.

Figure 15:
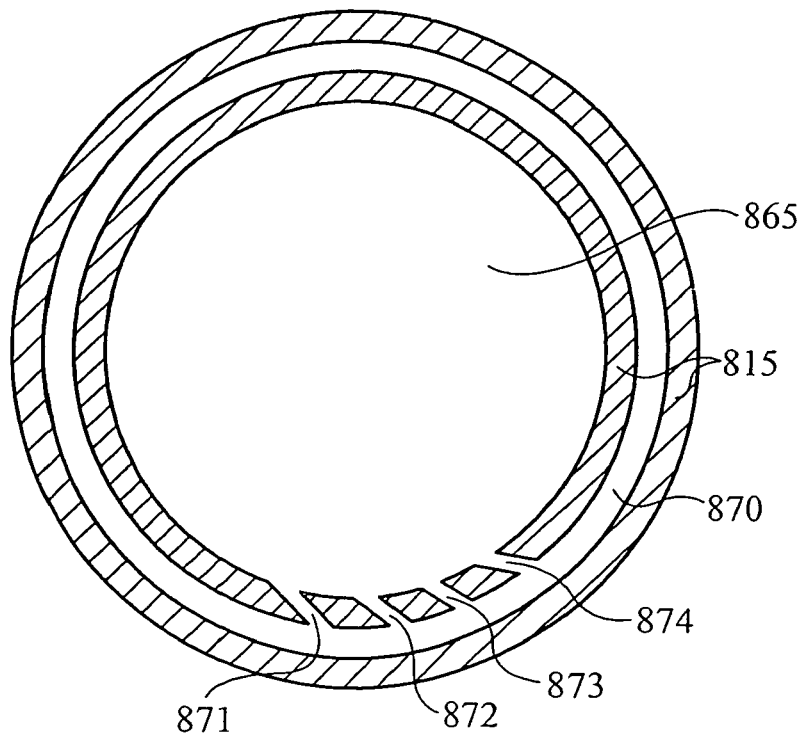
FIG. 15 is a bottom cross-sectional view of the processing chamber of FIG. 13, with the bottom plate removed, illustrating channels coupling a processing volume to the collector ring.

FIG. 15 is a bottom cross-sectional view of the processing chamber 800, with the bottom plate 819, the heater 821, and the lower elements 850A and 850B removed. FIG. 15 illustrates the channels 871-874 coupling the collector ring 870 to the processing volume 865. The channels 871-874 can be aligned along a circumference of the collector ring 860 in many ways. FIG. 15 shows the channels 871-874 aligned along a circumference of the collector ring 870 in a manner similar to that of the outlet ports 160B, 161B, and 162B illustrated in FIG. 11. It will be appreciated that the channels 871-874 can be configured in other ways in accordance with the present invention. For example, the channels 871-874 can be configured as are the outlet ports 150B, 151B, and 152B illustrated in FIG. 10. Alternatively, the channels 871-874 can be configured as are the outlet ports 170B, 171B, and 180B illustrated in FIG. 12. As illustrated in FIG. 15, the collector ring 870 traces a complete circle around an inner circumference of the ringed plate 815. It will be appreciated that in accordance with the present invention, the collector ring 870 can have other shapes, such as a partial ring that does not trace a complete circle around an inner circumference of the ringed plate 815.

Referring to FIGS. 13-15, in operation, a processing material, such as supercritical $CO_2$, is introduced into the dispenser ring 860. The supercritical $CO_2$ is then transmitted from the dispenser ring 860, through the channels 861-864, and into the processing volume 865 to process the workpiece 851. After the workpiece 851 has been processed, the supercritical $CO_2$ can be removed from the processing volume 865, through the channels 871-874, and into the collector ring 870. The removed supercritical $CO_2$ can then be routed to a collection vessel (not shown) or recirculated through the processing volume 865.

It will be appreciated that in accordance with the present invention, more than or fewer than four channels (such as the channels 861-864) can couple the dispenser ring 860 to the processing volume 865. The channels 861-864 can comprise valves, which control the introduction of the supercritical $CO_2$ from the dispenser ring 860 and into the processing volume 865. It will also be appreciated that more than or fewer than four channels (such as the channels 871-874) can couple the processing volume 865 to the collector ring 870. The channels 871-874 can comprise valves, which control the flow of the supercritical $CO_2$ from the processing volume 865 and into the collector ring 870.

It will be appreciated that processing materials other than supercritical $CO_2$ can be used to process the workpiece 851. It will also be appreciated that the processing material can be circulated within or through the processing volume 865 in many ways. For example, $CO_2$ can be introduced into the processing volume 865, pressurized to form supercritical $CO_2$, depressurized, and then exhausted to the collector ring 870. Alternatively, the processing material can be introduced into the processing cavity 865 and then immediately exhausted through the channels 871-874 and to the collector ring 870 to create a continuous flow of processing material through the processing volume 865.

The present invention secures a workpiece within a processing volume, by contacting the workpiece at or near an outer edge of the workpiece. This structure provides several advantages. First, a first volume is defined between a top face of the workpiece and the processing chamber, and a second volume is defined between a bottom face of the workpiece and the processing chamber. Thus, by introducing a processing material into both the first volume and the second volume, both the top face and the bottom face can be contacted by and thus processed by a processing material. Moreover, by ensuring that the first volume is substantially equal to the second volume, no pressure differential exists between the top face and the bottom face, minimizing the risk of fracturing or breaking the workpiece. Such pressure differentials are particularly harmful in high-pressure and supercritical processing environments. Furthermore, contacting an edge of the workpiece at discrete points rather than, for example, along an entire circumference of the workpiece, allows processing materials to flow and uniformly contact the faces of a workpiece.

Figure 16:
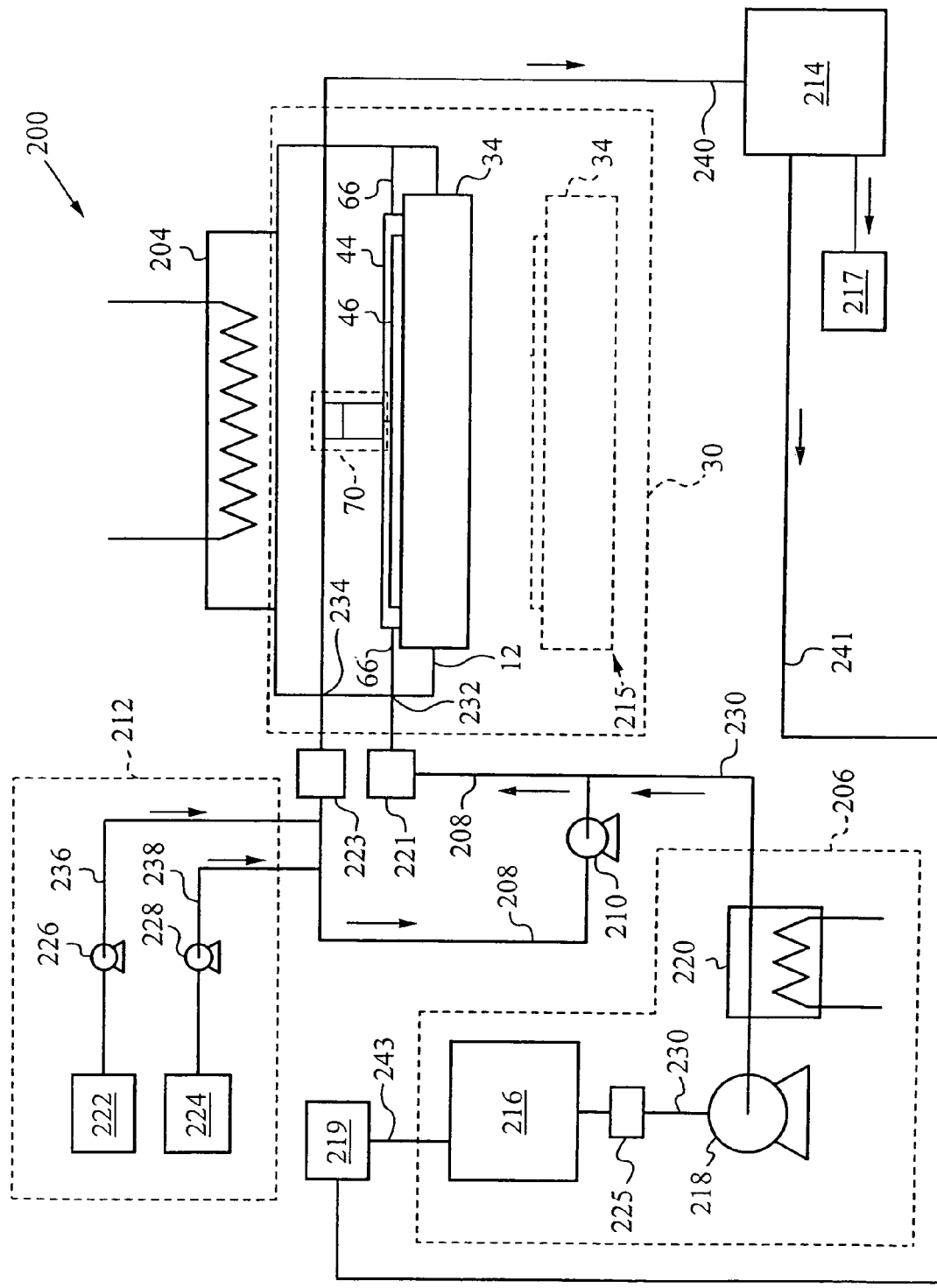
FIG. 16 shows a supercritical processing module for processing a wafer secured in accordance with one embodiment of the present invention.

FIG. 16 illustrates a supercritical processing module 200 for generating supercritical conditions in a pressure or processing chamber. The supercritical processing module 200 includes a pressure chamber 30, a pressure chamber heater 204, a carbon dioxide supply arrangement 206, a circulation loop 208, a circulation pump 210, a chemical agent and rinse agent supply arrangement 212, a separating vessel 214, a liquid/solid waste collection vessel 217, and a liquefying/purifying arrangement 219.

The pressure chamber 30 includes a pressure chamber housing 12 and a wafer platen 34. The pressure chamber housing 12 and the wafer platen 34 form a wafer cavity 44 for a semiconductor substrate 46. The pressure chamber housing 12 includes injection nozzles 66 and a two-port outlet 70. Preferably, the wafer platen 34 is held against the pressure chamber housing 12 using a hydraulic force. Alternatively, the wafer platen 34 is held against the pressure chamber housing 12 using a mechanical clamping force.

Preferably, the wafer platen 34 moves to a load/unload position 215 by releasing the hydraulic force. Alternatively, the wafer platen 34 moves to the load/unload position 215 upon release of the mechanical clamping force. Further alternatively, the wafer platen 34 moves to the load/unload position 215 by actuating a drive screw coupled to the wafer platen 34 or by using a pneumatic force.

The carbon dioxide supply arrangement 206 includes a carbon dioxide supply vessel 216, a carbon dioxide pump 218, and a carbon dioxide heater 220. The chemical agent and rinse agent supply arrangement 212 includes a chemical supply vessel 222, a rinse agent supply vessel 224, and first and second high pressure injection pumps, 226 and 228.

The carbon dioxide supply vessel 216 is coupled to the pressure chamber 30 via the carbon dioxide pump 218 and carbon dioxide piping 230. The carbon dioxide piping 230 includes the carbon dioxide heater 220 located between the carbon dioxide pump 218 and the pressure chamber 30. The pressure chamber heater 204 is coupled to the pressure chamber 30. The circulation pump 210 is located on the circulation loop 208. The circulation loop 208 couples to the pressure chamber 30 at a circulation inlet 232 and at a circulation outlet 234. The chemical supply vessel 222 is coupled to the circulation loop 208 via a chemical supply line 236. The rinse agent supply vessel 224 is coupled to the circulation loop 208 via a rinse agent supply line 238. The separating vessel 214 is coupled to the pressure chamber 30 via exhaust gas piping 240. The liquid/solid waste collection vessel 217 is coupled to the separating vessel 214.

The separating vessel 214 is preferably coupled to the liquefying/purifying arrangement 219 via return gas piping 241. The liquefying/purifying arrangement 219 is preferably coupled to the carbon dioxide supply vessel 216 via liquid carbon dioxide piping 243. Alternatively, an off-site location houses the liquefying/purifying arrangement 219, which receives exhaust gas in gas collection vessels and returns liquid carbon dioxide in liquid carbon dioxide vessels.

The pressure chamber heater 204 heats the pressure chamber 30. Preferably, the pressure chamber heater 204 is a heating blanket. Alternatively, the pressure chamber heater 204 is some other type of heater.

Preferably, first and second filters, 221 and 223, are coupled to the circulation loop 208. Preferably, the first filter 221 comprises a fine filter. More preferably, the first filter 221 comprises the fine filter configured to filter 0.05 µm and larger particles. Preferably, the second filter 223 comprises a coarse filter. More preferably, the second filter 223 comprises the coarse filter configured to filter 2-3 µm and larger particles. Preferably, a third filter 225 couples the carbon dioxide supply vessel 216 to the carbon dioxide pump 218. Preferably, the third filter 225 comprises the fine filter. More preferably, the third filter 225 comprises the fine filter configured to filter the 0.05 µm and larger particles.

It will be readily apparent to one skilled in the art that the supercritical processing module 200 includes valving, control electronics, and utility hookups which are typical of supercritical fluid processing systems. Further, it will be readily apparent to one skilled in the art that the injection nozzles 66 could be configured as part of the wafer platen 34 rather than as part of the chamber housing 12.

In operation, the supercritical processing module 200 is preferably used for removing the photoresist and photoresist residue from the semiconductor wafer 46. A photoresist removal process employing the supercritical processing module 200 comprises a loading step, a cleaning procedure, a rinsing procedure, and an unloading step.

In the loading step, the semiconductor wafer 46 is placed on the wafer platen 34 and then the wafer platen 34 is moved against the chamber housing 12, sealing the wafer platen 34 to the chamber housing 12 and, thus, forming the wafer cavity 44.

The cleaning procedure comprises first through fourth process steps. In the first process step, the wafer cavity 44 is pressurized by the carbon dioxide pump 218 to desired supercritical conditions. In the second process step, the first injection pump 226 pumps solvent from the chemical supply vessel 222 into the wafer cavity 44 via the chemical supply line and the circulation loop 208. Upon reaching desired supercritical conditions, the carbon dioxide pump stops pressurizing the wafer cavity 44. Upon reaching a desired concentration of the solvent, the first injection pump 226 stops injecting the solvent. In the third process step, the circulation pump 210 circulates supercritical carbon dioxide and the solvent through the wafer cavity 44 and the circulation loop 208 until the photoresist and the photoresist residue is removed from the semiconductor wafer 46. In the fourth process step, the wafer cavity 44 is partially exhausted while maintaining pressure above a critical pressure, then the wafer cavity 44 is re-pressurized by the carbon dioxide pump 218 and partially exhausted again while maintaining the pressure above the critical pressure.

The rinsing procedure comprises fourth through seventh process steps. In the fourth process step, the wafer cavity 44 is pressurized by the carbon dioxide pump 218. In the fifth process step, the second injection pump 228 pumps a rinse agent form the rinse agent supply vessel 224 into the wafer cavity 44 via the rinse agent supply line 238 and the circulation loop 208. Upon reaching a desired concentration of the rinse agent, the second injection pump 228 stops injecting the rinse agent. In the sixth process step, the circulation pump 210 circulates the supercritical carbon dioxide and the rinse agent through the wafer cavity 44 and the circulation loop 208 for a pre-determined time. In the seventh process step, the wafer cavity 44 is de-pressurized. Alternatively, it may be found that the fifth and sixth process steps are not needed.

In the unloading step, the wafer platen 34 is moved to the load/unload position 215 where the semiconductor 46 is removed from the wafer platen 34.

While the processing module 200 includes a wafer platen 34, those skilled in the art will appreciate that the processing module 200 can also be used to generate supercritical conditions to process a wafer secured by a holder in accordance with the present invention.

It will be readily apparent to one skilled in the art that various modifications may be made to the embodiments without departing from the spirit and scope of the invention as defined by the appended claims.

I claim:

1. A processing chamber, comprising:
    a. a first segment comprising a plurality of support elements having a triangular, wedge-shaped cross section configured to engage a workpiece at a first edge of the workpiece; and
    b. a second segment, comprising a plurality of support elements having a circular recessed configuration shaped to substantially match the contour of an edge of the workpiece and configured to engage the workpiece at a second edge of the workpiece,
    wherein the first segment and the second segment are positioned to secure a workpiece within the processing chamber so that a substantial portion of a first face of the workpiece and a substantial portion of a second face of the workpiece are exposed to a processing material introduced into the processing chamber.

2. The processing chamber of claim 1, further comprising:
    c. a top plate, the first segment coupled to the top plate; and
    d. a bottom plate, the second segment coupled to the bottom plate, wherein when the top plate and the bottom plate are brought together, the first segment and the second segment engage the workpiece, and further wherein the top plate and the bottom plate form a processing volume containing the workpiece.

3. The apparatus of claim 1, further comprising a wafer pick slidably mounted within the processing chamber, wherein in a first position the wafer pick is configured to support the workpiece so that the workpiece is disengaged from the second segment, and in a second position the wafer pick is disengaged from the workpiece, the workpiece engaged with the second segment.

4. The apparatus of claim 3, wherein the bottom plate is configured to receive the wafer pick, such that when the wafer pick is in the second position, the bottom plate and the wafer pick form a hermetically-sealed surface.

5. The processing chamber of claim 2, wherein the first segment and the second segment are configured so that when the top plate and the bottom plate are brought together, a volume between the workpiece and the top plate is substantially equal to a volume between the workpiece and the bottom plate.

6. The processing chamber of claim 2, further comprising:
    e. an inlet system configured to introduce a processing material into the processing volume; and
    f. an outlet system configured to exhaust the processing material from the processing volume.

7. The processing chamber of claim 6, wherein the inlet system includes inlet ports arranged substantially parallel to the first face and the second face of the workpiece.

8. The processing chamber of claim 6, wherein the inlet system comprises a plurality of inlet ports arranged annularly around a circumference of the processing chamber and the outlet system comprises a plurality of outlet ports arranged annularly around the circumference of the processing chamber.

9. The processing chamber of claim 8, wherein the plurality of inlet ports are arranged at an angle perpendicular to the circumference of the processing chamber.

10. The processing chamber of claim 8, wherein the plurality of inlet ports are arranged at angles not perpendicular to the circumference of the processing chamber.

11. The processing chamber of claim 8, wherein the plurality of outlet ports are arranged at an angle perpendicular to the circumference of the processing chamber.

12. The processing chamber of claim 8, wherein the plurality of outlet ports are arranged at angles not perpendicular to the circumference of the processing chamber.

13. The processing chamber of claim 8, wherein the plurality of inlet ports are positioned substantially opposite the plurality of output ports so that when the processing material is exhausted from the processing volume, the processing material is drawn across the first face and the second face of the workpiece.

14. The processing chamber of claim 8, wherein the plurality of inlet ports alternate with the plurality of outlet ports along the circumference of the processing chamber.

15. The processing chamber of claim 2, further comprising a supercritical condition generator coupled to the processing volume wherein the supercritical condition generator comprises a pump and a heater.

16. The processing chamber of claim 2, further comprising a first heater coupled to the top plate.

17. The processing chamber of claim 16, further comprising a second heater coupled to the bottom plate.

18. The processing chamber of claim 2, wherein the top plate comprises a dispenser ring coupled to the processing volume.

19. The processing chamber of claim 18, wherein the bottom plate comprises a collector ring coupled to the processing volume.

20. The processing chamber of claim 19, wherein the collector ring is coupled to the processing volume by a plurality of channels arranged at an angle perpendicular to a circumference of the processing chamber.

21. The processing chamber of claim 19, wherein the collector ring is coupled to the processing volume by a plurality of channels arranged at angles not perpendicular to a circumference of the processing chamber.

22. The processing chamber of claim 18, wherein the dispenser ring is coupled to the processing volume by a plurality of channels arranged at an angle perpendicular to a circumference of the processing chamber.

23. The processing chamber of claim 18, wherein the dispenser ring is coupled to the processing volume by a plurality of channels arranged at angles not perpendicular to a circumference of the processing chamber.

* * * * *

UNITED STATES PATENT AND TRADEMARK OFFICE
CERTIFICATE OF CORRECTION

PATENT NO. : 7,270,137 B2  
APPLICATION NO. : 10/425701  
DATED : September 18, 2007  
INVENTOR(S) : Kenji Yokomizo Page 1 of 1

It is certified that error appears in the above-identified patent and that said Letters Patent is hereby corrected as shown below:

IN THE SPECIFICATION

At column 3, line 52, please replace "120A-G" with -- 120A-C -- so that the corresponding phrase reads --the lower elements 120A-C are arranged--.

At column 9, line 11, please replace "E1" with -- E11 -- so that the corresponding phrase reads --at the point E11--.

Signed and Sealed this

Fourth Day of December, 2007

JON W. DUDAS  
*Director of the United States Patent and Trademark Office*